United States Patent
Suzawa et al.

(10) Patent No.: US 8,969,144 B2
(45) Date of Patent: Mar. 3, 2015

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Hideomi Suzawa, Atsugi (JP); Shinya Sasagawa, Chigasaki (JP); Akihiro Ishizuka, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/062,000

(22) Filed: Oct. 24, 2013

(65) Prior Publication Data
US 2014/0051209 A1    Feb. 20, 2014

Related U.S. Application Data

(62) Division of application No. 13/220,736, filed on Aug. 30, 2011, now Pat. No. 8,592,879.

(30) Foreign Application Priority Data

Sep. 13, 2010   (JP) .................................. 2010-204187

(51) Int. Cl.
*H01L 21/00* (2006.01)
*H01L 21/84* (2006.01)
(Continued)

(52) U.S. Cl.
CPC ...... *H01L 29/66969* (2013.01); *H01L 27/1214* (2013.01); *H01L 27/1225* (2013.01); *H01L 29/66742* (2013.01); *H01L 29/7869* (2013.01); *H01L 21/44* (2013.01); *H01L 27/1288* (2013.01)

USPC ............ 438/149; 438/151; 438/158; 438/104

(58) Field of Classification Search
None
See application file for complete search history.

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1 737 044 A   12/2006
EP   2 226 847 A   9/2010
(Continued)

OTHER PUBLICATIONS

Kamiya et al., "Carrier transport properties and electronic structures of amorphous oxide semiconductors: the present status," Kotai Butsuri (Solid State Physics), Sep. 1, 2009, vol. 44, No. 9, pp. 621-633, Agne Gijutsu Center.

(Continued)

*Primary Examiner* — Scott B Geyer
(74) *Attorney, Agent, or Firm* — Eric J. Robinson; Robinson Intellectual Property Law Office, P.C.

(57) ABSTRACT

Described is a method for manufacturing a semiconductor device. A mask is formed over an insulating film and the mask is reduced in size. An insulating film having a projection is formed using the mask reduced in size, and a transistor whose channel length is reduced is formed using the insulating film having a projection. Further, in manufacturing the transistor, a planarization process is performed on a surface of a gate insulating film which overlaps with a top surface of a fine projection. Thus, the transistor can operate at high speed and the reliability can be improved. In addition, the insulating film is processed into a shape having a projection, whereby a source electrode and a drain electrode can be formed in a self-aligned manner.

13 Claims, 12 Drawing Sheets

(51) Int. Cl.
*H01L 29/66* (2006.01)
*H01L 27/12* (2006.01)
*H01L 29/786* (2006.01)
*H01L 21/44* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0063270 A1 | 4/2004 | Ishikawa |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244063 A1 | 11/2006 | Isobe et al. |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0081091 A1 | 4/2010 | Hashimoto et al. |
| 2010/0092800 A1 | 4/2010 | Itagaki et al. |
| 2010/0109002 A1 | 5/2010 | Itagaki et al. |
| 2010/0241261 A1 | 9/2010 | Taguchi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-231961 | 8/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-332603 | 12/2006 |
| JP | 2007-096055 | 4/2007 |
| JP | 2007-123861 | 5/2007 |
| WO | WO 2004/114391 | 12/2004 |

OTHER PUBLICATIONS

Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

(56) References Cited

OTHER PUBLICATIONS

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)m$ (M=In,Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The Blue Phase," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 280-283.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the 16$^{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—GaZn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

(56) References Cited

OTHER PUBLICATIONS

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Nakamura, "Synthesis of Homologous Compound with New Long-Period Structure," Nirim Newsletter, Mar. 1, 1995, vol. 150, pp. 1-4.
Kikuchi et al., "Polymer-Stabilized Liquid Crystal Blue Phases," Nature Materials, Sep. 2, 2002, vol. 1, pp. 64-68.
Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.
Kitzerow et al., "Observation of Blue Phases in Chiral Networks," Liquid Crystals, 1993, vol. 14, No. 3, pp. 911-916.
Costello et al., "Electron Microscopy of a Cholesteric Liquid Crystal and its Blue Phase," Phys. Rev. A (Physical Review A), May 1, 1984, vol. 29, No. 5, pp. 2957-2959.
Meiboom et al., "Theory of the Blue Phase of Cholesteric Liquid Crystals," Phys. Rev. Lett. (Physical Review Letters), May 4, 1981, vol. 46, No. 18, pp. 1216-1219.
Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.
Orita et al., "Mechanism of Electrical Conductivity of Transparent $InGaZnO_4$," Phys. Rev. B (Physical Review B), Jan. 15, 2000, vol. 61, No. 3, pp. 1811-1816.
Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Janotti et al., "Native Point Defects in ZnO," Phys. Rev. B (Physical Review. B), Oct. 4, 2007, vol. 76, No. 16, pp. 165202-1-165202-22.
Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.
Janotti et al., "Oxygen Vacancies in ZnO," Appl. Phys. Lett. (Applied Physics Letters), 2005, vol. 87, pp. 122102-1-122102-3.
Oba et al., "Defect energetics in ZnO: A hybrid Hartree-Fock density functional study," Phys. Rev. B (Physical Review B), 2008, vol. 77, pp. 245202-1-245202-6.
Orita et al., "Amorphous transparent conductive oxide $InGaO_3(ZnO)m$ (m<4): a Zn 4s conductor," Philosophical Magazine, 2001, vol. 81, No. 5, pp. 501-515.
Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Mo et al., "Amorphous Oxide TFT Backplanes for Large Size AMOLED Displays," IDW '08: Proceedings of the 6th International Display Workshops, Dec. 3, 2008, pp. 581-584.
Kim et al., "High-Performance oxide thin film transistors passivated by various gas plasmas," 214th ECS Meeting, 2008, No. 2317, ESC.
Clark et al., "First Principles Methods Using CASTEP," Zeitschrift fur Kristallographie, 2005, vol. 220, pp. 567-570.
Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.
Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

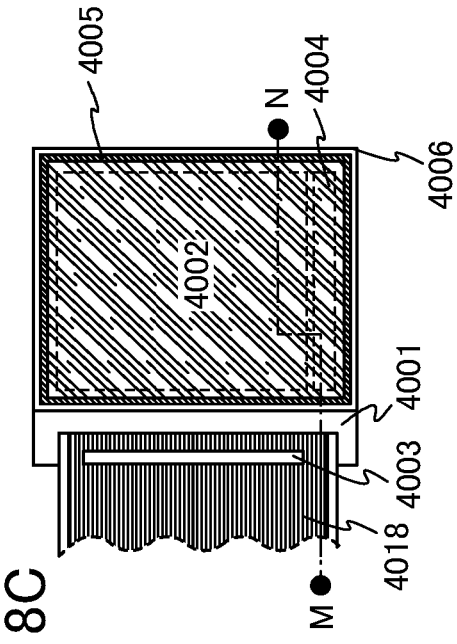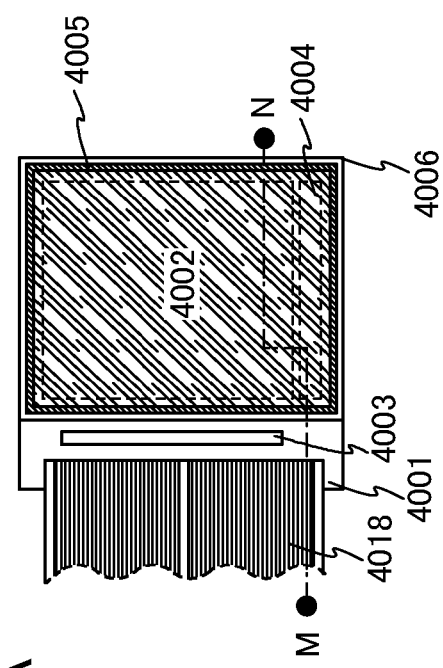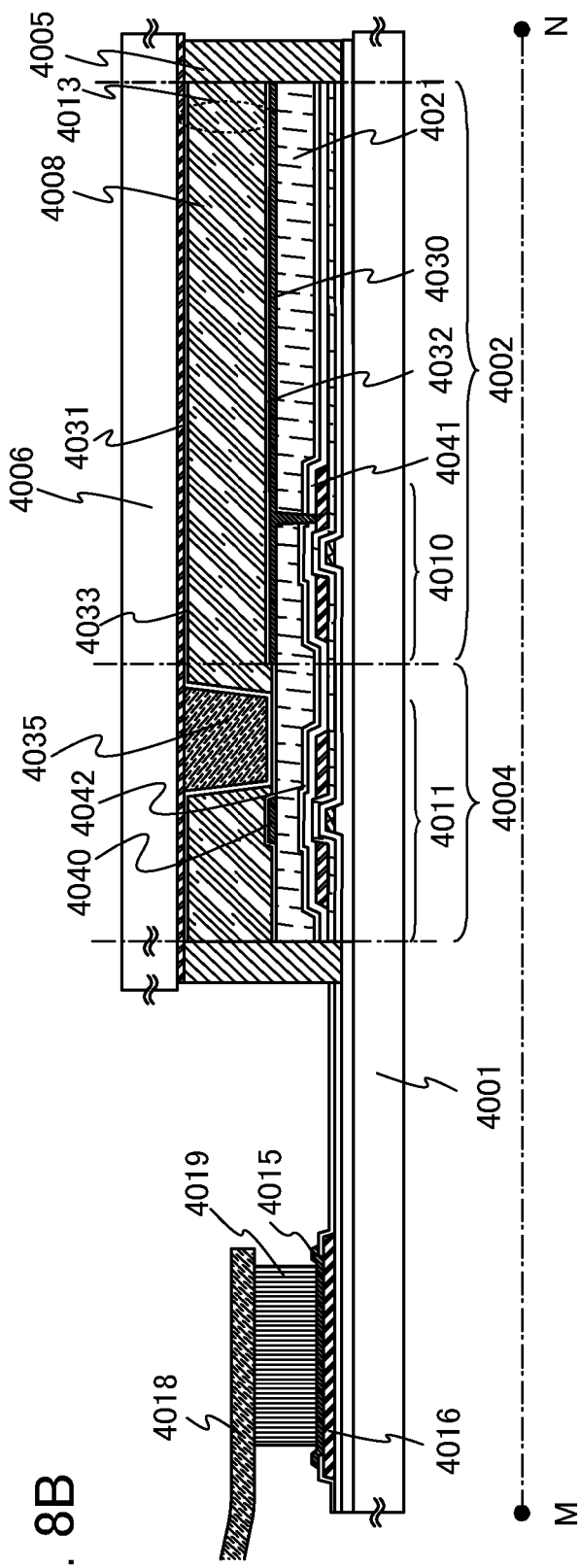

METHOD FOR MANUFACTURING SEMICONDUCTOR DEVICE

BACKGROUND OF THE INVENTION

1. Field of the Invention

The present invention relates to a method for manufacturing a semiconductor device. Note that semiconductor devices herein refer to general elements and devices which function by utilizing semiconductor characteristics.

2. Description of the Related Art

As a material having semiconductor characteristics applicable to thin film transistors, a metal oxide has attracted attention, and thin film transistors in which a channel formation region is formed using such a metal oxide having semiconductor characteristics are known (for example, see Patent Documents 1 and 2).

Further, in accordance with advance in performance of a semiconductor device, high-speed operation of a transistor has been required. For example, a technique has been reported in which high-speed operation is achieved by shortening of a channel length of a transistor (for example, see Patent Document 3).

REFERENCE

[Patent Document 1] Japanese Published Patent Application No. 2007-123861

[Patent Document 2] Japanese Published Patent Application No. 2007-96055

[Patent Document 3] Japanese Published Patent Application No. 2006-332603

SUMMARY OF THE INVENTION

An object of one embodiment of the present invention is to provide a semiconductor device which is capable of high-speed operation and has high reliability with the use of a transistor using an oxide semiconductor. Another object of one embodiment of the present invention is to provide a method for manufacturing the semiconductor device with high yield.

According to one embodiment of the disclosed invention, a mask is formed over an insulating film and the mask is reduced in size. An insulating film having a projection is formed using the mask reduced in size, and a transistor whose channel length is reduced is formed using the insulating film having a projection.

According to another embodiment of the disclosed invention, a planarization process is performed on at least part of a gate insulating film which is in contact with an oxide semiconductor film and provided over a top surface of the projection of the insulating film.

According to another embodiment of the disclosed invention, an insulating film is processed into a shape having a projection, a conductive film covering the projection is formed, and a planarization process is performed on the conductive film, whereby a source electrode and a drain electrode are formed in a self-aligned manner on the right and left of the projection.

Another embodiment of the disclosed invention is a method for manufacturing a semiconductor device including the steps of forming a conductive film over a first insulating film; forming a first mask over the conductive film; performing a slimming process by a plasma treatment on the first mask to form a second mask; performing an etching process on the first insulating film and the conductive film using the second mask to form a second insulating film having a projection and to form a gate electrode over a top surface of the projection of the second insulating film; forming a gate insulating film over the second insulating film and the gate electrode so as to cover the gate electrode; performing a planarization process on a surface of the gate insulating film which overlaps with the top surface of the projection of the second insulating film and then forming an oxide semiconductor film over the gate insulating film; and forming a source electrode and a drain electrode over the oxide semiconductor film so as not to overlap with the top surface of the projection of the second insulating film.

Another embodiment of the disclosed invention is a method for manufacturing a semiconductor device including the steps of forming a conductive film over a first insulating film; forming a first mask over the conductive film; performing a slimming process by a plasma treatment on the first mask to form a second mask; performing an etching process on the first insulating film and the conductive film using the second mask to form a second insulating film having a projection and to form a gate electrode over a top surface of the projection of the second insulating film; forming a gate insulating film over the second insulating film and the gate electrode so as to cover the gate electrode; forming a source electrode and a drain electrode over the gate insulating film so as not to overlap with the top surface of the projection of the second insulating film; performing a planarization process on part of a surface of the gate insulating film which overlaps with the top surface of the projection of the second insulating film; and forming an oxide semiconductor film over the gate insulating film so as to cover the source electrode and the drain electrode.

As the above plasma treatment, an ashing process can be used.

As the above planarization process, at least one of chemical mechanical polishing treatment and plasma treatment can be used.

As a method for forming the above source electrode and the above drain electrode, at least one of an etching process and chemical mechanical polishing treatment can be used.

According to another embodiment of the disclosed invention, a channel length of a transistor using an oxide semiconductor film can be reduced. Thus, high-speed operation of the transistor can be achieved.

According to another embodiment of the disclosed invention, a channel region of an oxide semiconductor film is formed over a gate insulating film which is planarized. Thus, high-speed operation of a transistor can be achieved.

According to another embodiment of the disclosed invention, an insulating film having a projection is used, whereby a source electrode and a drain electrode are formed in a self-aligned manner. Accordingly, misalignment is not caused in forming the source electrode and the drain electrode, so that a channel length can be reduced. Thus, a highly reliable semiconductor device can be manufactured, and yield and productivity can be improved.

BRIEF DESCRIPTION OF THE DRAWINGS

In the accompanying drawings:

FIGS. 8A and 8C area plan views and FIG. 8B is a cross-sectional view illustrating a semiconductor device;

DETAILED DESCRIPTION OF THE INVENTION

Figure 1A:
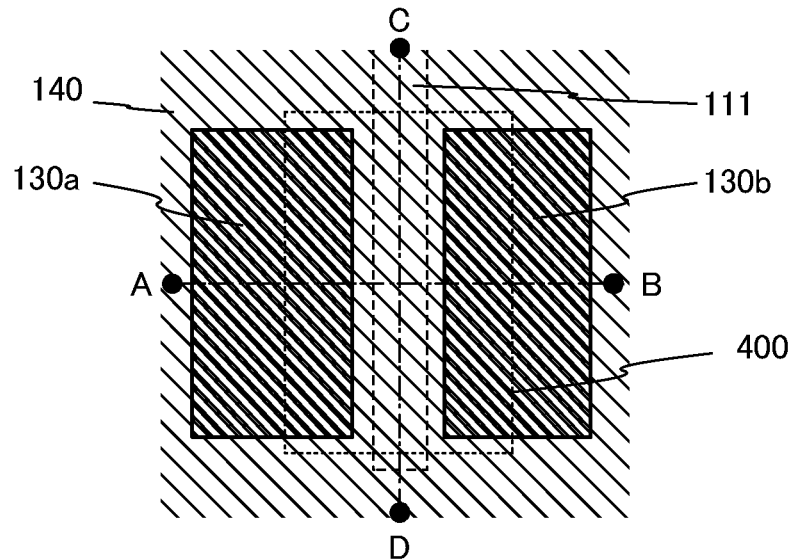
FIG. 1A is a plan view and FIGS. 1B and 1C are cross-sectional views illustrating an example of a structure of a semiconductor device.

Examples of embodiments of the present invention will be described below with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification, ordinal numbers such as "first", "second", and "third" are used in order to avoid confusion among components, and the terms do not limit the components numerically.

Note that in this specification, the root-mean-square (RMS) roughness is obtained by three-dimensionally expanding the RMS roughness of a cross section curve so as to be able to apply it to the measurement surface. The RMS is expressed as the square root of the average value of squares of deviations from a reference surface to a specific surface, and can be obtained by the following formula.

$$R_{ms} = \sqrt{\frac{1}{S_0} \int_{Y_1}^{Y_2} \int_{X_1}^{X_2} \{F(X, Y) - Z_0\}^2 dX dY}$$ [Formula 1]

Note that the measurement surface is a surface which is shown by all the measurement data, and is represented by the following formula.

$$Z = P(X, Y)$$ [Formula 2]

The specific surface is a surface which is an object of roughness measurement, and is a rectangular region which is surrounded by four points represented by the coordinates ($X_1$, $Y_1$), ($X_1$, $Y_2$), ($X_2$, $Y_1$), and ($X_2$, $Y_2$). The area of the specific surface when the specific surface is flat ideally is denoted by $S_0$. Note that $S_0$ is obtained by the following formula.

$$S_0 = |X_2 - X_1| \cdot |Y_2 - Y_1|$$ [Formula 3]

In addition, the reference surface refers to a surface parallel to an X-Y surface at the average height of the specific surface.

In short, when the average value of the height of the specific surface is denoted by $Z_0$, the height of the reference surface is also denoted by $Z_0$. Note that $Z_0$ can be obtained by the following formula.

$$Z_0 = \frac{1}{S_0} \int_{Y_1}^{Y_2} \int_{X_1}^{X_2} F(X, Y) dX dY$$ [Formula 4]

Note that in this specification, the root-mean-square (RMS) roughness is calculated in a region of 10 nm×10 nm, preferably 100 nm×100 nm, more preferably 1 μm×1 μm from an AFM image obtained using an atomic force microscope (AFM).

Embodiment 1

In this embodiment, an example of a method for manufacturing a semiconductor device will be described with reference to FIGS. 1A to 1C, FIGS. 2A to 2E, FIGS. 3A to 3E, and FIGS. 4A to 4C.

Figure 1B:
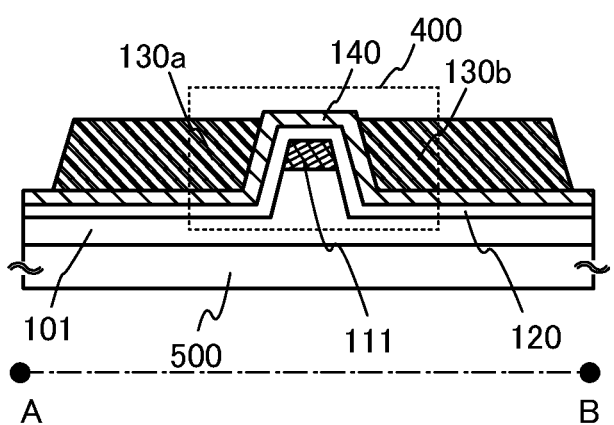
Figure 1C:
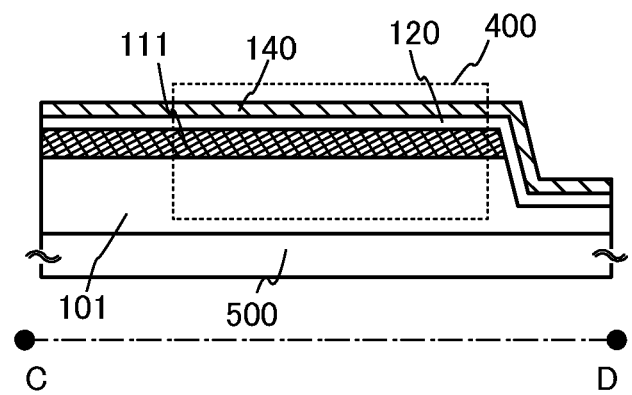

A transistor 400 which is an example of a semiconductor device is illustrated in FIGS. 1A to 1C. FIG. 1A is a top view of the transistor 400. FIG. 1B is a cross-sectional view taken along line A-B of FIG. 1A. FIG. 1C is a cross-sectional view taken along line C-D of FIG. 1A. The transistor 400 illustrated in FIG. 1B includes an insulating film 101 having a projection over a substrate 500; a gate electrode 111 formed over a top surface of the projection of the insulating film 101; a gate insulating film 120 formed so as to cover the gate electrode 111; an oxide semiconductor film 140 formed over the gate insulating film 120; a source or drain electrode 130a; and a source or drain electrode 130b.

In the transistor 400 illustrated in FIGS. 1A to 1C, it is preferable that the oxide semiconductor film 140 be highly purified by sufficient removal of an impurity such as hydrogen and sufficient supply of oxygen. Specifically, for example, the hydrogen concentration of the oxide semiconductor film 140 is less than or equal to $5 \times 10^{19}$ atoms/cm$^3$, preferably less than or equal to $5 \times 10^{18}$ atoms/cm$^3$, and more preferably less than or equal to $5 \times 10^{17}$ atoms/cm$^3$. Note that the hydrogen concentration in the oxide semiconductor film 140 is measured by secondary ion mass spectroscopy (SIMS). A carrier concentration which is less than $1 \times 10^{12}$/cm$^3$, preferably less than $1 \times 10^{11}$/cm$^3$, and more preferably less than $1.45 \times 10^{10}$/cm$^3$ is obtained in the oxide semiconductor film 140 which is highly purified by sufficiently reducing the hydrogen concentration in such a manner and in which defect levels in an energy gap caused by oxygen deficiency are reduced by sufficient supply of oxygen. For example, the off-state current (per unit channel width (1 μm), here) at room temperature (25° C.) is lower than or equal to 100 zA (1 zA (zeptoampere) is $1 \times 10^{-21}$ A), preferably lower than or equal to 10 zA. In this manner, with the use of an oxide semiconductor which is made to be an i-type (intrinsic) oxide semiconductor or a substantially i-type oxide semiconductor, the transistor 400 which has extremely favorable off-state current characteristics can be obtained.

Further, the oxide semiconductor film 140 is preferably a film from which impurities such as an alkali metal and an alkaline earth metal are sufficiently removed. For example, the sodium concentration of the oxide semiconductor film 140 is less than or equal to $5 \times 10^{16}$ atoms/cm$^3$, preferably less than or equal to $1 \times 10^{16}$ atoms/cm$^3$, more preferably less than or equal to $1 \times 10^{15}$ atoms/cm$^3$. The lithium concentration of the oxide semiconductor film 140 is less than or equal to $5\times10^{15}$ atoms/cm$^3$, preferably less than or equal to $1\times10^{15}$ atoms/cm$^3$. The potassium concentration of the oxide semiconductor film 140 is less than or equal to $5\times10^{15}$ atoms/cm$^3$, preferably less than or equal to $1\times10^{15}$ atoms/cm$^3$. Note that the sodium concentration, the lithium concentration, and the potassium concentration of the oxide semiconductor film 140 are measured by secondary ion mass spectroscopy (SIMS).

Note that it has been pointed out that an oxide semiconductor is insensitive to impurities, and there is no problem when a considerable amount of metal impurities is contained in the film; therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. When an insulating film in contact with the oxide semiconductor film is an oxide, an alkali metal, in particular, sodium (Na) diffuses into the insulating film and becomes Na$^+$. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, the concentration of an alkali metal is preferably reduced in the case where the hydrogen concentration in the oxide semiconductor film is less than or equal to $5\times10^{19}$ atoms/cm$^3$, particularly less than or equal to $5\times10^{18}$ atoms/cm$^3$.

Note that in the transistor 400 illustrated in FIGS. 1A to 1C, the oxide semiconductor film 140 is used without being processed into an island shape. Using the oxide semiconductor film 140 which is not processed into an island shape can prevent contamination of the oxide semiconductor film 140 due to an etching process in the processing. Note that in order to suppress a leakage current which is caused between elements due to miniaturization, the oxide semiconductor film 140 which is processed into an island shape may be used.

A method for manufacturing the transistor 400 will be described below.

Figure 2A:
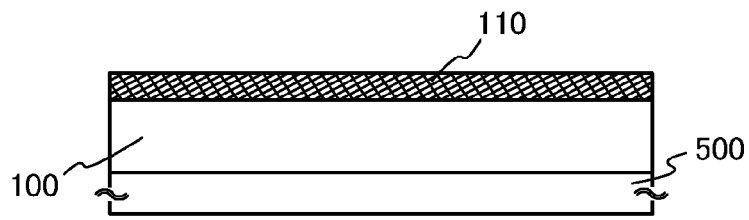
FIGS. 2A to 2E are cross-sectional views illustrating a manufacturing process of a semiconductor device.

First, an insulating film 100 is formed over the substrate 500, and a conductive film 110 is formed over the insulating film 100 (see FIG. 2A).

Although there is no particular limitation on a substrate which can be used as the substrate 500, it is necessary that the substrate 500 has at least heat resistance high enough to withstand heat treatment to be performed later. For example, a substrate such as a glass substrate, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium or the like; an SOI substrate, or the like may be used as long as the substrate has an insulating surface, and a semiconductor element may be provided over the substrate. Still alternatively, the substrate 500 may be provided with a base film.

The insulating layer 100 can be formed by a PVD method, a CVD method, or the like. The insulating film 100 can be formed using an inorganic insulating material such as silicon oxide, silicon oxynitride, silicon nitride, hafnium oxide, aluminum oxide, or gallium oxide. In this embodiment, the insulating film 100 having a thickness of greater than or equal to 100 nm and less than or equal to 500 nm is formed using silicon oxide by a PVD method.

The conductive film 110 can be formed by a PVD method such as a sputtering method or a CVD method such as a plasma CVD method. As a material of the conductive film 110, an element selected from aluminum, chromium, copper, tantalum, titanium, molybdenum, and tungsten, an alloy containing any of these elements as a component, or the like can be used. Further, one or more materials selected from manganese, magnesium, zirconium, beryllium, neodymium, and scandium may be used.

The conductive film 110 may have either a single-layer structure or a stacked-layer structure of two or more layers. For example, the conductive film can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. In this embodiment, the conductive film 110 is formed using tungsten by a PVD method to have a single-layer structure having a thickness of greater than or equal to 50 nm and less than or equal to 200 nm.

The insulating film 100 is formed using an inorganic insulating material. When a mask is formed over such a material, the mask may fall and it may be difficult to form a fine projection. However, when the conductive film 110 is formed over the insulating film 100, the mask can be formed stably, so that the insulating film 101 having a fine projection can be formed. Therefore, by the insulating film 101 having a fine projection, a transistor whose channel length (L) is reduced can be formed. That is, by provision of the conductive film 110 over the insulating film 100, subsequent fine processing of the insulating film 100 and the conductive film 110 becomes possible.

Figure 2B:
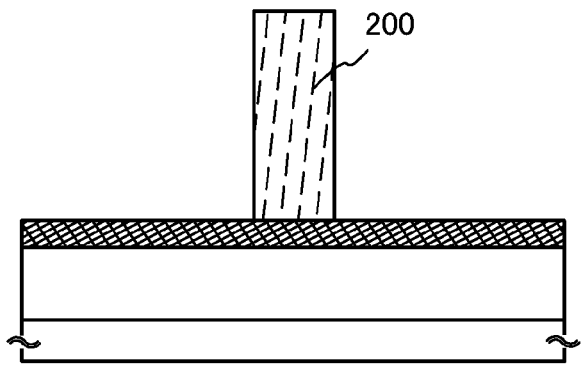

Next, a mask 200 is formed over the conductive film 110 (see FIG. 2B).

The mask 200 can be formed by a photolithography technique or the like using a photosensitive material such as a photoresist. For light exposure at the time of forming the mask 200, extreme ultraviolet light having a wavelength as short as greater than or equal to several nanometers and less than or equal to several tens of nanometers is preferably used. In the light exposure by extreme ultraviolet light, the resolution is high and the focus depth is large. Thus, the mask 200 can have a fine pattern.

As long as it is possible to form the mask 200 having a sufficiently fine pattern, a different method such as an ink-jet method may be used to form the mask 200. In this case, it is unnecessary to use a photosensitive material such as a photoresist as a material of the mask 200. In this embodiment, the mask 200 is formed by a stepper method.

Figure 2C:
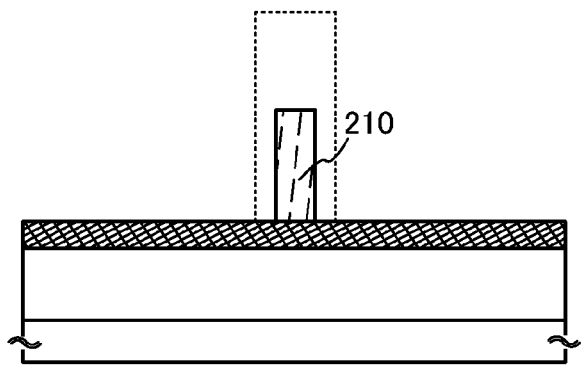

Next, a slimming process by plasma treatment is performed on the mask 200 to form a mask 210 whose line width is smaller (see FIG. 2C). Note that the slimming process refers to a process for reducing the size of the mask.

As the slimming process by plasma treatment, for example, an ashing process in which oxygen in a radical state (an oxygen radical) or the like is used can be employed. However, the slimming process is not limited to the above ashing process as long as the mask 200 can be processed into a finer pattern.

The channel length (L) of the transistor 400 is determined by the width of the gate electrode which is formed using the mask 210. That is, the channel length (L) of the transistor 400 is determined by the width of the mask 210 in the channel length direction (a direction in which carriers flow), which is formed by the slimming process. Therefore, it is preferable to employ a process with high controllability as the slimming process.

The slimming process can be performed under the following conditions: the pressure is 3.0 Pa and the atmosphere is an oxygen atmosphere (the flow rate of oxygen is 100%). By the conditions, the mask 200 can be formed more finely than the minimum feature size (the resolution limit) of a light-exposure apparatus. For example, the line width of the mask 200 can be reduced to a length of less than or equal to half of the resolution limit of the light exposure apparatus, preferably less than or equal to one third of the resolution limit of the light exposure apparatus. For example, the line width can become greater than or equal to 20 nm and less than or equal to 2000 nm (2 µm), preferably greater than or equal to 20 nm and less than or equal to 350 nm. This enables a further reduction in the channel length (L) of the transistor.

Figure 2D:
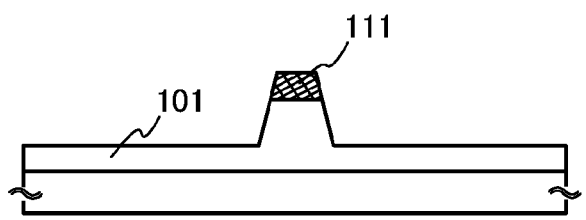

Next, the insulating film 100 and the conductive film 110 are processed using the mask 210, whereby the insulating film 101 having a projection is formed and the gate electrode 111 is formed over a top surface of the projection of the insulating film 101 (see FIG. 2D).

The insulating film 101 may be processed into a shape which has only a projection. Alternatively, as illustrated in FIG. 2D, the insulating film 101 may be processed into a shape which has a projection and spreads over the substrate 500. However, when the insulating film 101 is processed into a shape which has only a projection, it may be difficult to keep the fine projection unchanged because the projection may fall. Therefore, in order to keep the projection unchanged, the insulating film 101 is preferably processed into a shape which has a projection and spreads over the substrate 500.

As a method for processing the insulating film 100 and the conductive film 110 into the insulating film 101 and the gate electrode 111, for example, an etching process can be employed. Although either a dry etching process or a wet etching process may be performed as the etching process, a dry etching process with high controllability is preferably used for miniaturization.

In this embodiment, in order to process the insulating film 100 and the conductive film 110 into the insulating film 101 and the gate electrode 111, an etching process is performed on the conductive film 110, and after that, an etching process is performed on the insulating film 100. As the etching process of the conductive film 110, a dry etching process may be performed under the following conditions: the pressure is 1.5 Pa and the atmosphere is an atmosphere of mixed gas of carbon tetrafluoride ($CF_4$), chlorine ($Cl_2$), and oxygen ($O_2$) at a flow ratio of 5:5:2. As the etching process of the insulating film 100, for example, a dry etching process may be performed under the following conditions: the pressure is 5.5 Pa and the atmosphere is an atmosphere of a mixed gas of trifluoromethane ($CHF_3$) and helium (He) (a flow ratio of 1:20).

Further, the etching processes of the conductive film 110 and the insulating film 100 may be performed so that the gate electrode 111 and the projection of the insulating film 101 which are to be formed have a tapered shape. The taper angle can be, for example, greater than or equal to 60° and less than or equal to 80°.

The channel length (L) of the transistor is determined by the gate electrode 111 formed in the above-described manner. Since the size of the gate electrode 111 when viewed from above is substantially the same as the mask 210, the channel length (L) of the transistor is greater than or equal to 20 nm and less than 2000 nm (2 µm), preferably greater than or equal to 20 nm and less than or equal to 350 nm.

Figure 2E:
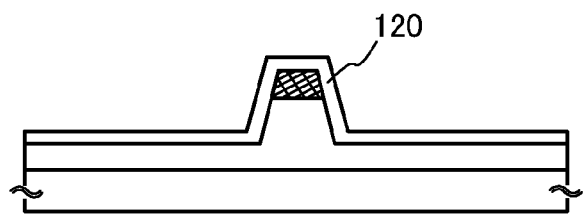

Next, the gate insulating film 120 is formed over the insulating film 101 and the gate electrode 111 so as to cover the gate electrode 111 (see FIG. 2E).

The gate insulating film 120 can be formed by a CVD method, a sputtering method, or the like. The gate insulating film 120 is preferably formed so as to contain silicon oxide, silicon nitride, silicon oxynitride, aluminum oxide, gallium oxide, tantalum oxide, hafnium oxide, yttrium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), hafnium aluminate to which nitrogen is added ($HfAl_xO_yN_z$ ($x>0$, $y>0$, $z>0$)), or the like. The gate insulating film 120 may have a single-layer structure or a stacked-layer structure. There is no particular limitation on the thickness; however, in the case where a semiconductor device is reduced in size, the thickness is preferably small for ensuring an operation of the transistor. For example, in the case where silicon oxide is used, the thickness can be greater than or equal to 1 nm and less than or equal to 100 nm, preferably greater than or equal to 10 nm and less than or equal to 50 nm.

When the gate insulating film 120 is formed thin as described above, gate leakage due to a tunnel effect or the like becomes a problem. In order to solve the problem of gate leakage, the gate insulating film 120 may be formed using a high dielectric constant (high-k) material such as hafnium oxide, tantalum oxide, yttrium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), or hafnium aluminate to which nitrogen is added ($HfAl_xO_yN_z$ ($x>0$, $y>0$, $z>0$)). The use of a high-k material for the gate insulating film 120 makes it possible to increase the thickness in order to suppress gate leakage as well as ensuring electric characteristics. For example, hafnium oxide is preferable as a material of the gate insulating film because the relative permittivity of hafnium oxide is about 15, which is much higher than that of silicon oxide which is 3 to 4. Note that a stacked-layer structure of a film containing a high-k material and a film containing any of silicon oxide, silicon nitride, silicon oxynitride, silicon nitride oxide, aluminum oxide, and the like may be employed.

Figure 3A:
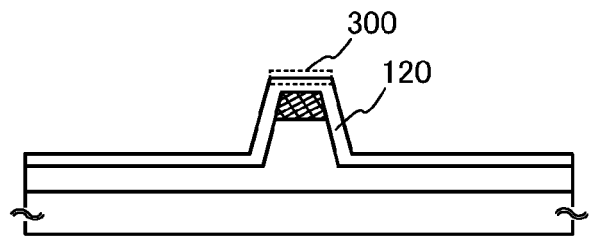
FIGS. 3A to 3E are cross-sectional views illustrating a manufacturing process of a semiconductor device.

Next, a planarization process is performed on a surface of a region of the gate insulating film 120 which overlaps with the top surface of the projection of the insulating film 101 (a region 300) (see FIG. 3A).

As the planarization process, plasma treatment or the like can be used. Note that plasma treatment is preferably performed under conditions that the gate insulating film 120 is not eliminated. For example, plasma treatment may be performed under the following conditions: the thickness of the gate insulating film 120 is approximately 100 nm, and the atmosphere is an atmosphere of a rare gas such as helium, argon, krypton, or neon. Note that a method, conditions and the like of the planarization process may be selected as appropriate. Note that in the case of performing plasma treatment as the planarization process, plasma treatment may be performed on a region of the gate insulating film 120 which does not overlap with the top surface of the projection of the insulating film 101 in addition to the region 300.

Figure 3B:
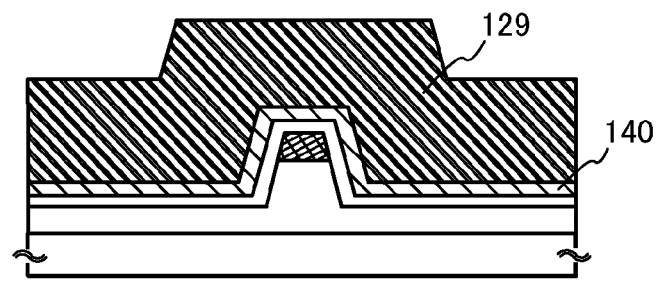

Next, the oxide semiconductor film 140 is formed over the gate insulating film 120, and a conductive film 129 is formed over the oxide semiconductor film 140 (see FIG. 3B).

The oxide semiconductor film 140 can be formed using an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. Note that, for example, an In—Ga—Zn-based oxide means an oxide containing In, Ga, and Zn, and there is no limitation on the ratio of In, Ga, and Zn. The In—Ga—Zn-based oxide may include a metal element other than In, Ga, and Zn.

In particular, an In—Ga—Zn-based oxide semiconductor material has sufficiently high resistance when there is no electric field and thus off current can be sufficiently reduced. In addition, with high field-effect mobility, the In—Ga—Zn-based oxide semiconductor material is suitable for a semiconductor device.

As a typical example of the In—Ga—Zn-based oxide semiconductor material, one represented by InGaO$_3$(ZnO)$_m$ (m>0) is given. Using M instead of Ga, there is an oxide semiconductor material represented by InMO$_3$(ZnO)$_m$ (m>0). Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above compositions are derived from crystal structures and are only examples.

As a target for forming the oxide semiconductor film 140 by a sputtering method, it is particularly preferable to use a target having a composition ratio of In:Ga:Zn=1:x:y (x is greater than or equal to 0 and y is greater than or equal to 0.5 and less than or equal to 5) except oxygen. For example, a target having a composition ratio of In$_2$O$_3$:Ga$_2$O$_3$:ZnO=1:1:2 [molar ratio], or the like can be used. Alternatively, a target having a composition ratio of In$_2$O$_3$:Ga$_2$O$_3$:ZnO=1:1:1 [molar ratio], a target having a composition ratio of In$_2$O$_3$:Ga$_2$O$_3$:ZnO=1:1:4 [molar ratio], or a target having a composition ratio of In$_2$O$_3$:ZnO=1:2 [molar ratio] can be used.

In this embodiment, the oxide semiconductor film 140 having an amorphous structure is formed by a sputtering method using a target for forming an In—Ga—Zn—O-based oxide semiconductor film. The thickness of the oxide semiconductor film 140 is greater than or equal to 1 nm and less than or equal to 100 nm, preferably greater than or equal to 2 nm and less than or equal to 50 nm, and further preferably greater than or equal to 3 nm and less than or equal to 30 nm. By employing a structure according to the invention disclosed herein, a short channel effect due to miniaturization can be suppressed even in the case of using the oxide semiconductor film 140 having such a thickness. Note that an appropriate thickness differs depending on an oxide semiconductor material used, the application of a semiconductor device, or the like; therefore, it is also possible to set the thickness as appropriate depending on the material to be used, the application, or the like.

The relative density of a metal oxide in the target for forming an oxide semiconductor film is greater than or equal to 80%, preferably greater than or equal to 95%, more preferably greater than or equal to 99.9%. With the use of a target for forming an oxide semiconductor film with high relative density, the oxide semiconductor film 140 with a dense structure can be formed.

The atmosphere in which the oxide semiconductor film 140 is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to less than or equal to 1 ppm (preferably, less than or equal to 10 ppb).

In forming the oxide semiconductor film 140, the substrate is held in a treatment chamber that is maintained at reduced pressure and is heated so that the substrate temperature is higher than or equal to 100° C. and lower than 550° C., preferably higher than or equal to 200° C. and lower than or equal to 400° C. Alternatively, the substrate temperature in forming the oxide semiconductor film 140 may be a room temperature (higher than or equal to 15° C. and lower than or equal to 35° C.). Then, a sputtering gas from which hydrogen, water, and the like are removed is introduced while moisture in the treatment chamber is removed, and the aforementioned target is used, whereby the oxide semiconductor film 140 is formed. The oxide semiconductor film 140 is formed while the substrate is heated, so that impurities contained in the oxide semiconductor film 140 can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. Since a hydrogen atom, a compound containing a hydrogen atom, such as water (H$_2$O), or the like (preferably a compound containing a carbon atom as well) can be removed from the treatment chamber by evacuating the chamber with a cryopump or the like, the impurity concentration of the oxide semiconductor film can be reduced.

For example, conditions for forming the oxide semiconductor film 140 can be set as follows: the distance between the substrate and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. A pulse direct current (DC) power supply is preferable because powder substances (also referred to as particles or dust) generated in the film formation can be reduced and the film thickness can be made uniform.

Note that before the oxide semiconductor film 140 is formed by a sputtering method, reverse sputtering in which an argon gas is introduced and plasma is generated may be performed so that a material attached to a surface over which the oxide semiconductor film 140 is to be formed (e.g., a surface of the gate insulating film 120) is removed. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that an atmosphere of nitrogen, helium, oxygen, or the like may be used instead of an argon atmosphere.

After the oxide semiconductor film 140 is formed, heat treatment (first heat treatment) is preferably performed on the oxide semiconductor film 140. Excessive hydrogen (including water and a hydroxyl group) in the oxide semiconductor film 140 can be removed by the first heat treatment. The first heat treatment is performed at higher than or equal to 250° C. and lower than or equal to 700° C., preferably higher than or equal to 450° C. and lower than or equal to 600° C. or lower than the strain point of the substrate.

The heat treatment can be performed in such a way that, for example, the substrate is introduced into an electric furnace in which a resistance heating element or the like is used and heated at 450° C. under a nitrogen atmosphere for an hour. During the heat treatment, the oxide semiconductor film 140 is not exposed to the air to prevent the entry of water and hydrogen.

The heat treatment apparatus is not limited to the electric furnace and may be an apparatus for heating a substrate by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating a substrate by radiation of light (electromagnetic waves) emitted form a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, a GRTA process may be performed as follows. The substrate is placed in an inert gas atmosphere which has been heated, heated for several minutes, and taken out of the inert gas atmosphere. The GRTA process enables high-temperature heat treatment for a short time. Moreover, the GRTA process can be used even in the conditions where the temperature exceeds the upper temperature limit of the substrate. Note that the inert gas may be switched to a gas including oxygen during the process. This is because defect levels in an energy gap due to oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

In any case, impurities are reduced by the first heat treatment so that the i-type (intrinsic) or substantially i-type oxide semiconductor film 140 is obtained. Accordingly, a transistor having extremely excellent characteristics can be realized.

The above heat treatment (first heat treatment) can be referred to as dehydration treatment, dehydrogenation treatment, or the like because of its effect of removing hydrogen, water, and the like. The dehydration treatment or the dehydrogenation treatment can be performed, for example, after subsequent formation of the source or drain electrode 130a and the source or drain electrode 130b as long as it is after the oxide semiconductor film 140 is formed. Such dehydration treatment or dehydrogenation treatment may be conducted once or plural times.

After the oxide semiconductor film 140 is formed, the oxide semiconductor film 140 may be processed into an island-shaped oxide semiconductor film. The oxide semiconductor film 140 can be processed into an island-shaped oxide semiconductor film by an etching process, for example. The etching process may be performed either before the heat treatment or after the heat treatment. Although a dry etching process is preferable in terms of element miniaturization, a wet etching process may also be used. An etching gas or an etchant can be selected as appropriate depending on a material to be etched.

The conductive film 129 can be formed by a PVD method such as a sputtering method or a CVD method such as a plasma CVD method. As a material of the conductive film 129, an element selected from aluminum, chromium, copper, tantalum, titanium, molybdenum, and tungsten, an alloy containing any of these elements as a component, or the like can be used. Further, one or more materials selected from manganese, magnesium, zirconium, beryllium, neodymium, and scandium may be used.

The conductive film 129 may have either a single-layer structure or a stacked-layer structure of two or more layers. For example, the conductive film can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order.

The conductive film 129 may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used. In this embodiment, the conductive film 129 is formed using tungsten by a PVD method to have a single-layer structure having a thickness of greater than or equal to 150 nm and less than or equal to 500 nm.

Note that, in terms of a later etching process, the conductive film 129 needs to be formed to have a larger thickness than a total thickness of the gate electrode 111 and the height of the projection of the insulating film 101 (h shown in FIG. 3C). The height h of the projection of the insulating film 101 can be set to be greater than or equal to 150 nm and less than or equal to 300 nm, for example.

Figure 3C:
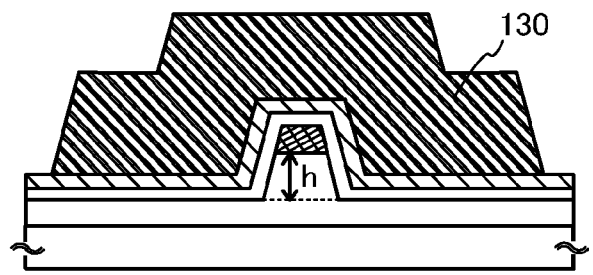

Next, the conductive film 129 is processed by an etching process to form a conductive film 130 (see FIG. 3C). Note that the conductive film 129 may be etched either by a dry etching process or a wet etching process; however, a dry etching process with high controllability is preferably used for miniaturization. The conductive film 130 is processed into the source or drain electrode 130a and the source or drain electrode 130b in a later step. Therefore, the conductive film 130 may be processed into a desired shape as the source or drain electrode 130a and the source or drain electrode 130b as appropriate.

Figure 3D:
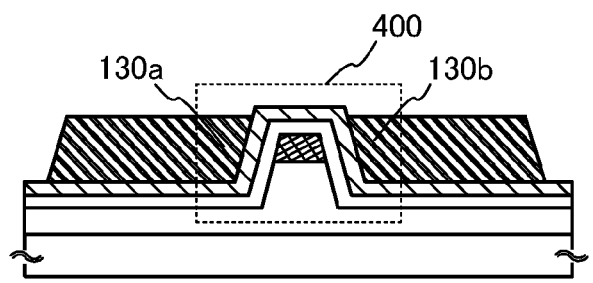

Next, a planarization process, an etching process, or the like is performed on the conductive film 130 so as to expose a surface of the oxide semiconductor film 140 which overlaps with the top surface of the projection of the insulating film 101, thereby forming the source or drain electrode 130a and the source or drain electrode 130b (see FIG. 3D).

A structure illustrated in FIG. 3D has difference in height between the surface of the oxide semiconductor film 140 which overlaps with the projection of the insulating film 101 and a surface of an uppermost portion of the source or drain electrode 130*a*, and between the surface of the oxide semiconductor film 140 which overlaps with the projection of the insulating film 101 and a surface of an uppermost portion of the source or drain electrode 130*b*. The structure having difference in height can be obtained in such a manner that, for example, an etching process, a polishing process, a combination thereof, or the like is performed on the conductive film 130.

In order to obtain the structure having difference in height, for example, an etching process can be performed after a polishing process by a CMP process (a chemical mechanical polishing process). Specifically, first, a CMP process is performed on the conductive film 130 until when its surface has the same height as the surface of the oxide semiconductor film 140 which overlaps with the top surface of the projection of the insulating film 101. After that, an etching process is performed on the conductive film 130 under conditions where the oxide semiconductor film 140 is not easily etched.

The CMP process is a method for planarizing a surface of an object to be processed by a combination of chemical and mechanical actions. More specifically, the CMP process is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing between the object to be processed and the polishing cloth. The CMP process as the polishing process may be performed once or plural times.

As the etching process, either or both of a dry etching process and a wet etching process can be employed. Note that etching conditions where a selectivity ratio of the conductive film 130 with respect to the oxide semiconductor film 140 is high (for example, the selectivity ratio of the conductive film 130 with respect to the oxide semiconductor film 140 is 14:1) are employed. For example, a dry etching process may be performed under the following conditions: the pressure is 1.6 Pa and the atmosphere is an atmosphere of a mixed gas of carbon tetrafluoride ($CF_4$), chlorine ($Cl_2$), and oxygen ($O_2$) at a flow ratio of 5:5:2.

In addition, as another example of forming the structure having difference in height, an etching process can be performed after formation of a film. Specifically, first, a film is formed over the conductive film 130. The film formed over the conductive film 130 can be formed using liquid glass, liquid photoresist, or the like by a spin coating method, an ink-jet method, or the like. This film is formed for the purpose of planarizing the outmost surface of the transistor under manufacture, and thus is called a planarization film in this specification. The planarization film may be hardened or solidified by a treatment with light or heat.

Next, an etching process (a first etching process) is performed on the planarization film and the conductive film 130 until when they have the same height as the surface of the oxide semiconductor film 140 which overlaps with the top surface of the projection of the insulating film 101. After that, an etching process (a second etching process) is further performed under conditions where the oxide semiconductor film 140 is not easily etched.

As the second etching process, the above etching conditions where the selectivity ratio of the conductive film 130 with respect to the oxide semiconductor film 140 is high is preferably employed.

The difference in height between the surface of the oxide semiconductor film 140 which overlaps with the top surface of the projection of the insulating film 101 and the surface of the uppermost portion of the source or drain electrode 130*a*, and between the surface of the oxide semiconductor film 140 which overlaps with the top surface of the projection of the insulating film 101 and the surface of the uppermost portion of the source or drain electrode 130*b* is preferably greater than or equal to 5 nm and less than or equal to 20 nm. By the difference in height, the path of electric current in the oxide semiconductor film 140 is extended. This makes it possible to alleviate the concentration of an electric field in the transistor 400 and to suppress a short channel effect.

An etching process or a planarization process is performed so as to expose the surface of the oxide semiconductor film 140 which overlaps with the top surface of the projection of the insulating film 101 in this manner, whereby the source or drain electrode 130*a* and the source or drain electrode 130*b* can be formed in a self-aligned manner. Accordingly, misalignment is not caused in forming the source or drain electrode 130*a* and the source or drain electrode 130*b*, so that a channel length can be reduced. Accordingly, a highly reliable semiconductor device can be manufactured.

After formation of the source or drain electrode 130*a* and the source or drain electrode 130*b*, a second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variations in electric characteristics of transistors.

Note that although the second heat treatment is performed after formation of the source or drain electrode 130*a* and the source or drain electrode 130*b* in this embodiment, the timing of the second heat treatment is not particularly limited thereto. For example, the second heat treatment may be performed after formation of the conductive film 130. Alternatively, the second heat treatment may be performed following the first heat treatment, the first heat treatment may double as the second heat treatment, or the second heat treatment may double as the first heat treatment. Further, an insulating film may be provided over the source or drain electrode 130*a*, the source or drain electrode 130*b*, and the oxide semiconductor film 140. After formation of the insulating film, the second heat treatment may be performed. In the case where an insulating film provided on and in contact with the oxide semiconductor film 140 contains oxygen, the oxide semiconductor film 140 is supplied with oxygen, so that oxygen deficiency in the oxide semiconductor film 140 can be filled. Oxygen deficiency in the oxide semiconductor film 140 is filled, whereby a normally-on state of the transistor 400 due to shift of a threshold voltage in the negative direction can be prevented and reliability of the transistor 400 can be improved. Note that "the insulating film contains oxygen" here means that the insulating film can release oxygen by heat treatment. The insulating film that can release oxygen by heat treatment can be formed by a sputtering method, for example.

By performing at least one of the first heat treatment and the second heat treatment as described above, the oxide semiconductor film 140 can be highly purified so as to include a substance including a hydrogen atom as few as possible. In this manner, an i-type (intrinsic) or substantially i-type oxide semiconductor film can be formed.

Thus, the transistor 400 can be formed.

Note that an etching process is further performed after the above etching process, whereby the source or drain electrode 130a and the source or drain electrode 130b may be processed into a desired pattern. Details of the etching process for processing the pattern can be similar to those of the above-described etching process.

Figure 3E:
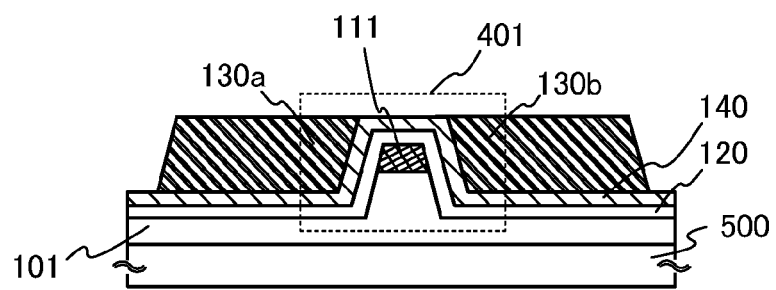

Although the structure having difference in height between the surface of the oxide semiconductor film 140 which overlaps with the top surface of the projection of the insulating film 101 and the surface of the uppermost portion of the source or drain electrode 130a, and between the surface of the oxide semiconductor film 140 which overlaps with the top surface of the projection of the insulating film 101 and the surface of the uppermost portion of the source or drain electrode 130b is described in this embodiment, a structure having no difference in height may be also employed as a transistor 401 illustrated in FIG. 3E. That is, only the CMP process or the first etching process described with reference to FIG. 3D may be performed to provide the structure having no difference in height between the surface of the oxide semiconductor film 140 which overlaps with the top surface of the projection of the insulating film 101 and the surface of the uppermost portion of the source or drain electrode 130a, and between the surface of the oxide semiconductor film 140 which overlaps with the top surface of the projection of the insulating film 101 and the surface of the uppermost portion of the source or drain electrode 130b.

Figure 4A:
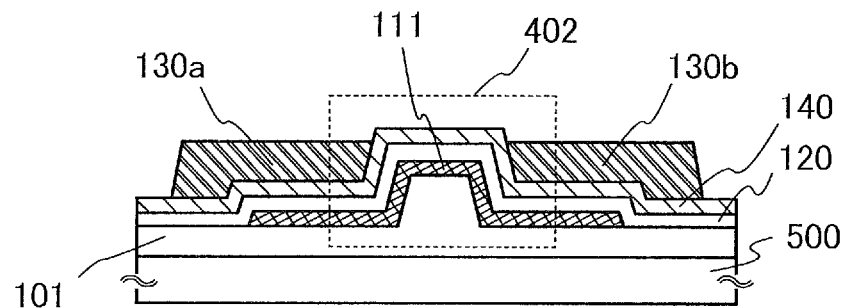
FIGS. 4A to 4C are cross-sectional views each illustrating an example of a structure of a semiconductor device.

Further, although a structure is described in which the gate electrode 111 is formed over the top surface of the projection of the insulating film 101 so as not to overlap with the source or drain electrode 130a and the source or drain electrode 130b in this embodiment, a structure may be employed in which the gate electrode 111 is formed so as to overlap with the source or drain electrode 130a and the source or drain electrode 130b as a transistor 402 illustrated in FIG. 4A. The transistor 402 has a channel length (L) which is reduced in a manner similar to the transistor 400.

Figure 4B:
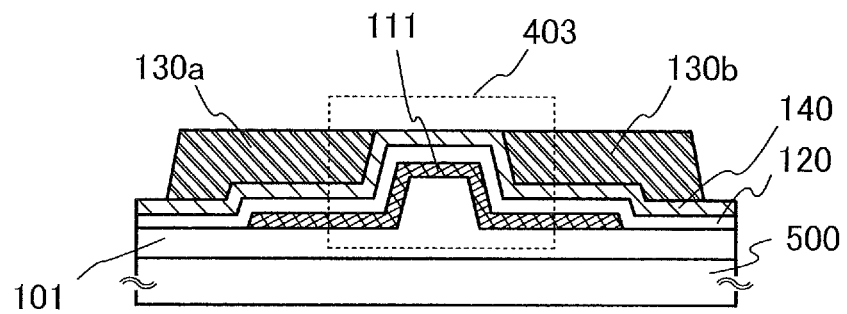

Further, as a transistor 403 illustrated in FIG. 4B, a structure may be also employed in which the gate electrode 111 has a structure similar to the gate electrode 111 of the transistor 402 and which has no difference in height between the surface of the oxide semiconductor film 140 which overlaps with the top surface of the projection of the insulating film 101 and the surface of the uppermost portion of the source or drain electrode 130a, and between the surface of the oxide semiconductor film 140 which overlaps with the top surface of the projection of the insulating film 101 and the surface of the uppermost portion of the source or drain electrode 130b. A method for manufacturing the transistor 402 of FIG. 4A and the transistor 403 of FIG. 4B is different from a method for manufacturing the transistor 400 of FIGS. 1A to 1C regarding the insulating film 101 and the gate electrode 111. In manufacturing the transistor 402 and the transistor 403, a mask is formed over the insulating layer 100, a slimming process is performed on the mask to be reduced in size, and the insulating film 101 is formed using the mask reduced in size. After that, a conductive film is formed and processed into the gate electrode 111.

Figure 4C:
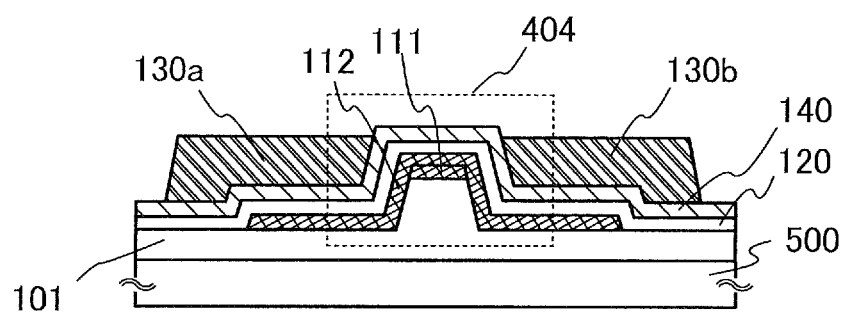

Further, as a transistor 404 illustrated in FIG. 4C, a structure may also be employed in which the gate electrode 111 has a structure similar to the gate electrode 111 of the transistor 400, and a conductive film 112 (e.g. a film formed using the same material as the gate electrode) which overlaps with the source or drain electrode 130a and the source or drain electrode 130b is provided over the gate electrode 111. In manufacturing the transistor 404, a mask is formed over the insulating layer 100 and the conductive layer 110, a slimming process is performed on the mask to be reduced in size, and the insulating film 101 and the gate electrode 111 are formed using the mask reduced in size. After that, a conductive film is formed and processed into the conductive film 112.

Thus, a transistor including an oxide semiconductor film whose channel length (L) is reduced can be formed.

According to one embodiment of the present invention, the mask is reduced in size by the slimming process, whereby the channel length of the transistor using an oxide semiconductor film can be reduced. Thus, high-speed operation of the transistor becomes possible.

Further, according to another embodiment of the present invention, a surface of the gate insulating film 120 which overlaps with the top surface of the projection of the insulating film 101 (a region in contact with a channel region of the oxide semiconductor film) is planarized, whereby high-speed operation of the transistor can be achieved.

Further, according to another embodiment of the present invention, the insulating film 101 having a projection is used, whereby the source or drain electrode 130a and the source or drain electrode 130b are formed in a self-aligned manner. Accordingly, misalignment is not caused in forming the source or drain electrode 130a and the source or drain electrode 130b, so that the channel length can be reduced. Thus, a highly reliable semiconductor device can be manufactured, and yield and productivity can be improved.

The methods and structures described in this embodiment can be combined as appropriate with any of the methods and structures described in the other embodiments.

Embodiment 2

In this embodiment, an example of a method for manufacturing a semiconductor device which is different from that described in Embodiment 1 will be described with reference to FIGS. 5A to 5C, FIGS. 6A to 6E, and FIGS. 7A to 7C. A main difference between Embodiment 1 and Embodiment 2 is the stacking order and the structure of the oxide semiconductor film 140, the source or drain electrode 130a, and the source or drain electrode 130b. The main difference will be described in this embodiment.

Figure 5A:
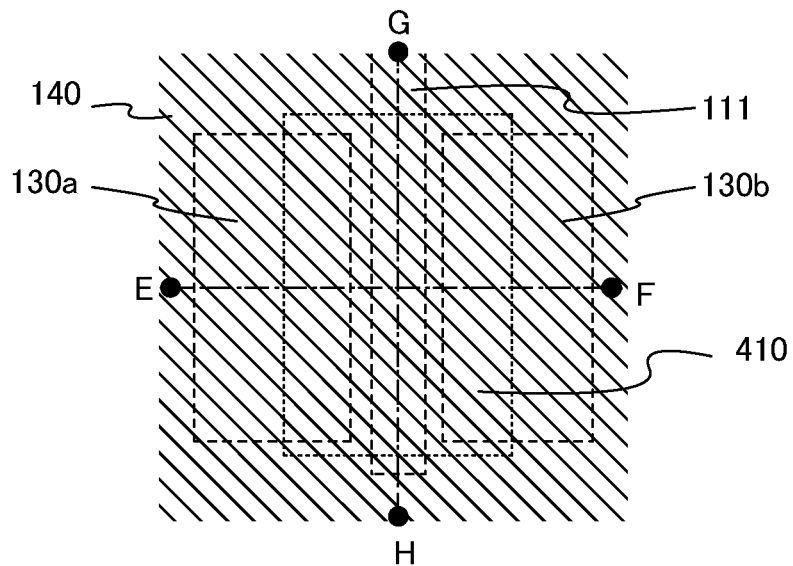
FIG. 5A is a plan view and FIGS. 5B and 5C are cross-sectional views illustrating an example of a structure of a semiconductor device.
Figure 5B:
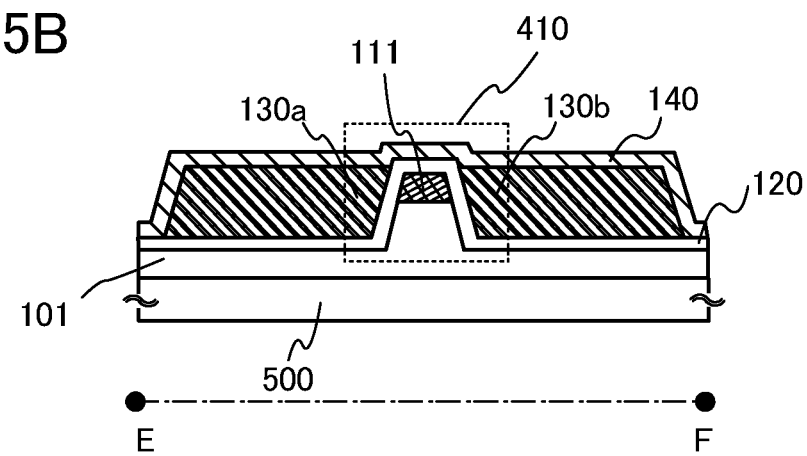
Figure 5C:
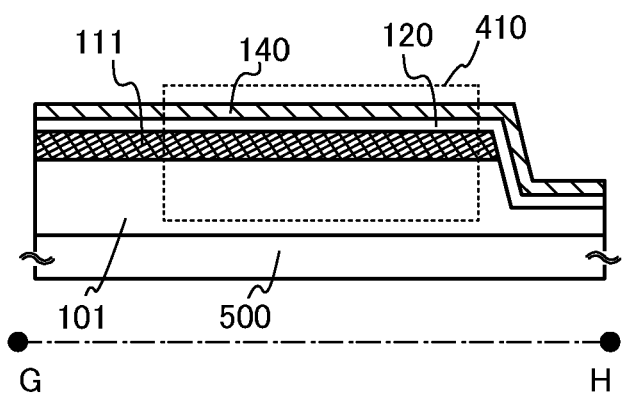

FIGS. 5A to 5C illustrate a transistor 410 which is an example of a semiconductor device. FIG. 5A is a top view of the transistor 410. FIG. 5B is a cross-sectional view taken along line E-F of FIG. 5A. FIG. 5C is a cross-sectional view taken along line G-H of FIG. 5A. The transistor 410 illustrated in FIG. 5B includes the insulating film 101 having a projection over the substrate 500; the gate electrode 111 formed over the top surface of the projection of the insulating film 101; the gate insulating film 120 formed so as to cover the gate electrode 111; the source or drain electrode 130a and the source or drain electrode 130b formed over the gate insulating film 120; and the oxide semiconductor film 140.

A method for manufacturing the transistor 410 will be described below.

First, the insulating film 101 having a projection is formed over the substrate 500, the gate electrode 111 is formed over the top surface of the projection of the insulating film 101, and the gate insulating film 120 is formed over the insulating film 101 and the gate electrode so as to cover the gate electrode 111. These steps can be performed in a manner similar to those illustrated in FIGS. 2A to 2E; therefore, detailed description thereof will be omitted.

Figure 6A:
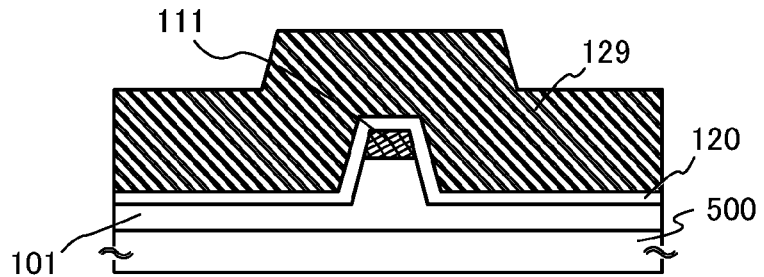
FIGS. 6A to 6E are cross-sectional views illustrating a manufacturing process of a semiconductor device.

Next, the conductive film 129 for forming the source or drain electrode 130a and the source or drain electrode 130b (including a wiring formed in the same layer as the source or drain electrode 130a and the source or drain electrode 130b) is formed over the gate insulating film 120 (see FIG. 6A). For the material and the formation method of the conductive film 129, description of the conductive film 129 of FIG. 3B in Embodiment 1 can be referred to; therefore, detailed description thereof will be omitted.

Figure 6B:
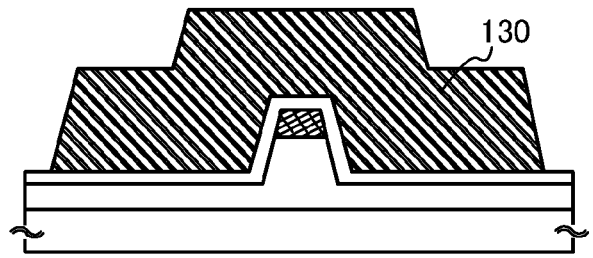

Next, the conductive film 129 is processed by an etching process to form the conductive film 130 (see FIG. 6B). For the formation method of the conductive film 130, description of the conductive film 130 of FIG. 3C in Embodiment 1 can be referred to; therefore, detailed description thereof will be omitted.

Figure 6C:
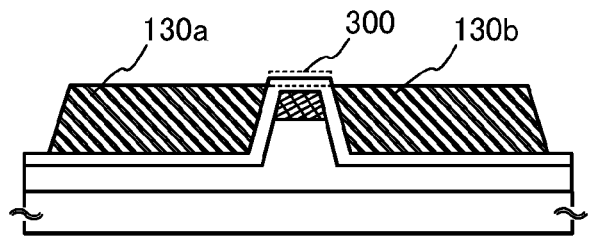

Next, a planarization process, an etching process, or the like is performed on the conductive film 130 so as to expose the surface of the gate insulating film 120 which overlaps with the projection of the insulating film 101, thereby forming the source or drain electrode 130a and the source or drain electrode 130b (see FIG. 6C).

A structure illustrated in FIG. 6C has difference in height between the surface of the gate insulating film 120 which overlaps with the top surface of the projection of the insulating film 101 and a surface of an uppermost portion of the source or drain electrode 130a, and between the surface of the gate insulating film 120 which overlaps with the top surface of the projection of the insulating film 101 and a surface of an uppermost portion of the source or the drain electrode 130b. The structure having difference in height can be obtained in such a manner that an etching process, a planarization process, a combination thereof, or the like is performed on the conductive film 130.

In order to obtain the structure having difference in height, for example, an etching process can be performed after a CMP process (a chemical mechanical polishing process) which is a planarization process. Specifically, first, a CMP process is performed on the conductive film 130 until when it has the same height as the surface of the gate insulating film 120 which overlaps with the top surface of the projection of the insulating film 101. Thus, the source or drain electrode 130a and the source or drain electrode 130b are formed. In addition, the region 300 which is planarized is formed over the surface of the gate insulating film 120 which overlaps with the top surface of the projection of the insulating film 101. After that, an etching process is performed on the conductive film 130 under conditions where the gate insulating film 120 is not easily etched. Note that for a polishing process of a CMP process, description of FIG. 3D in Embodiment 1 can be referred to; therefore, detailed description thereof will be omitted.

Through the CMP process, the root-mean-square (RMS) roughness of a surface of the region 300 can be less than or equal to 1 nm (preferably, less than or equal to 0.5 nm).

The CMP process as the polishing process may be performed once or plural times. When the CMP process is performed in plural times, it is preferable that the first polishing step be performed at a high polishing rate and be followed by a final polishing step at a low polishing rate. By combining polishing with different polishing rates, planarity of the surfaces of the region 300 can be further improved.

By such a planarization process, planarity of the surface of the region 300 of the gate insulating film 120 on which the oxide semiconductor film 140 is to be formed later is improved, so that characteristics of the transistor can be improved.

As the etching process, either or both of a dry etching process and a wet etching process can be employed. Note that etching conditions where a selectivity ratio of the conductive film 130 with respect to the gate insulating film 120 is high (for example, the selectivity ratio of the conductive film 130 with respect to the gate insulating film 120 is 3.2:1) are employed. For example, a dry etching process may be performed under the following conditions: the pressure is 1.6 Pa and the atmosphere is an atmosphere of a mixed gas of carbon tetrafluoride ($CF_4$), chlorine ($Cl_2$), and oxygen ($O_2$) at a flow ratio of 5:5:2.

Further, as another example of forming the structure having difference in height, an etching process using a planarization film can be given.

As a specific example, first, a planarization film is formed over the conductive film 130. For the material and the formation method of the planarization film, description in Embodiment 1 can be referred to; therefore, detailed description thereof will be omitted. An etching process (the first etching process) is performed on the planarization film and the conductive film 130 until when they have the same height as the surface of the gate insulating film 120 which overlaps with the top surface of the projection of the insulating film 101. After that, an etching process (the second etching process) is further performed on the conductive film 130 under conditions where the gate insulating film 120 is not easily etched.

For the second etching process, etching conditions where the selectivity ratio of the conductive film 130 with respect to the gate insulating film 120 is high may be employed.

The difference in height between the surface of the gate insulating film 120 which overlaps with the top surface of the projection of the insulating film 101 and the surface of the uppermost portion of the source or drain electrode 130a, and between the surface of the gate insulating film 120 which overlaps with the top surface of the projection of the insulating film 101 and the surface of the uppermost portion of the source or drain electrode 130b, which is provided by the above process, is preferably greater than or equal to 5 nm and less than or equal to 20 nm. By the difference in height, the path of electric current in the oxide semiconductor film 140 is extended. This makes it possible to alleviate the concentration of an electric field in the transistor 410 and to suppress a short channel effect.

The above planarization process, the above etching process, or the like is performed to expose the surface of the gate insulating film 120 which overlaps with the top surface of the projection of the insulating film 101, so that the source or drain electrode 130a and the source or drain electrode 130b can be formed using the conductive film 130 in a self-aligned manner. Accordingly, the number of masks necessary for the process can be reduced and yield can be improved. Further, by the planarization process, planarity of the surface of the region 300 of the gate insulating film 120 on which the oxide semiconductor film 140 is to be formed later is improved, so that characteristics of the transistor 410 can be improved.

Figure 6D:
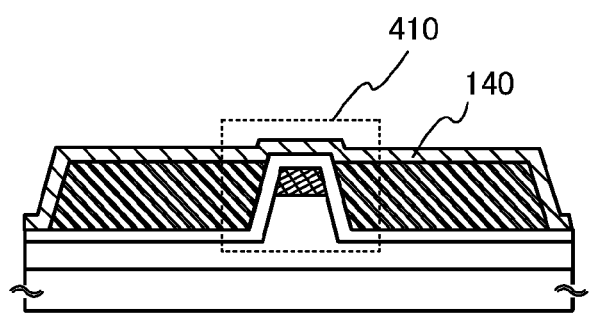

Next, the oxide semiconductor film 140 is formed over the source or drain electrode 130a, the source or drain electrode 130b, and the gate insulating film 120 (see FIG. 6D). For the material and the formation method of the oxide semiconductor film 140, description of FIG. 3B in Embodiment 1 can be referred to; therefore, detailed description thereof will be omitted.

Thus, the transistor 410 can be formed.

Note that an etching process is further performed after the above etching process, whereby the source or drain electrode 130a and the source or drain electrode 130b may be processed into a desired pattern. Details of the etching process for processing the pattern can be similar to those of the above-described etching process.

Figure 6E:
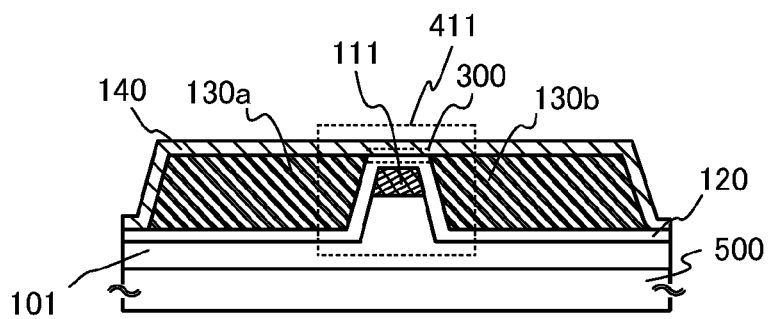

Although the structure having difference in height between the surface of the gate insulating film 120 which overlaps with the top surface of the projection of the insulating film 101 and the surface of the uppermost portion of the source or drain electrode 130*a*, and between the surface of the gate insulating film 120 which overlaps with the top surface of the projection of the insulating film 101 and the surface of the uppermost portion of the source or drain electrode 130*b* is described in this embodiment, a structure having no difference in height may be also employed as a transistor 411 illustrated in FIG. 6E. That is, only the CMP process or the first etching process described with reference to FIG. 6C may be performed to provide the structure having no difference in height between the surface of the gate insulating film 120 which overlaps with the top surface of the projection of the insulating film 101 and the surface of the uppermost portion of the source or drain electrode 130*a*, and between the surface of the gate insulating film 120 which overlaps with the top surface of the projection of the insulating film 101 and the surface of the uppermost portion of the source or drain electrode 130*b*.

Figure 7A:
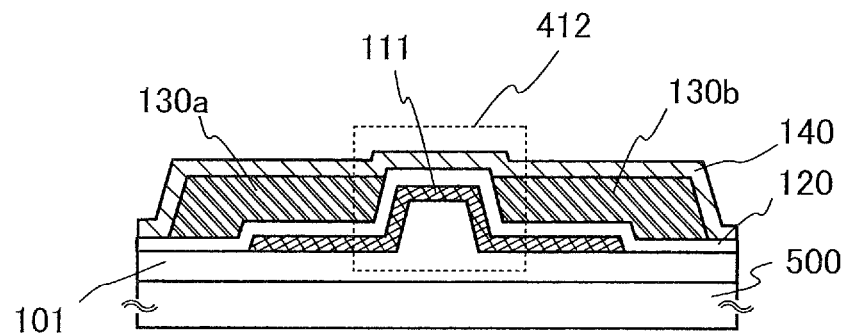
FIGS. 7A to 7C are cross-sectional views each illustrating an example of a structure of a semiconductor device.

Further, although a structure is described in which the gate electrode 111 is formed over the top surface of the projection of the insulating film 101 so as not to overlap with the source or drain electrode 130*a* and the source or drain electrode 130*b* in this embodiment, a structure may be employed in which the gate electrode 111 is formed so as to overlap with the source or drain electrode 130*a* and the source or drain electrode 130*b* as a transistor 412 illustrated in FIG. 7A. The transistor 412 has a channel length (L) which is reduced in a manner similar to the transistor 400.

Figure 7B:
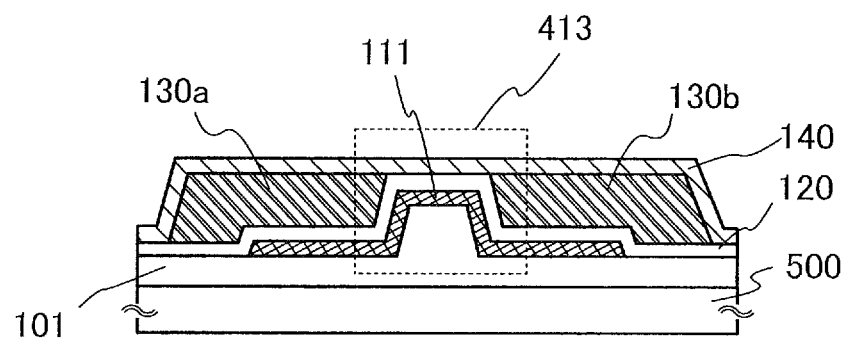

Further, as a transistor 413 illustrated in FIG. 7B, a structure may be also employed in which the gate electrode 111 has a structure similar to the gate electrode 111 of the transistor 412 and which has no difference in height between the surface of the gate insulating film 120 which overlaps with the top surface of the projection of the insulating film 101 and the surface of the uppermost portion of the source or drain electrode 130*a*, and between the surface of the gate insulating film 120 which overlaps with the top surface of the projection of the insulating film 101 and the surface of the uppermost portion of the source or drain electrode 130*b*. A method for manufacturing the transistor 412 of FIG. 7A and the transistor 413 of FIG. 7B is different from a method for manufacturing the transistor 400 of FIGS. 1A to 1C regarding the insulating film 101 and the gate electrode 111. In manufacturing the transistor 412 and the transistor 413, a mask is formed over the insulating layer 100, a slimming process is performed on the mask to be reduced in size, and the insulating film 101 is formed using the mask reduced in size. After that, a conductive film is formed and processed into the gate electrode 111.

Figure 7C:
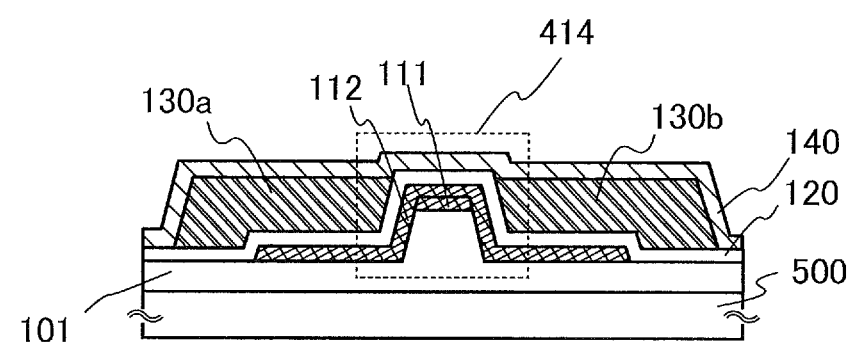

Further, as a transistor 414 illustrated in FIG. 7C, a structure may also be employed in which the gate electrode 111 has a structure similar to the gate electrode 111 of the transistor 410, and a conductive film 112 (e.g. a film formed using the same material as the gate electrode) which overlaps with the source or drain electrode 130*a* and the source or drain electrode 130*b* is provided over the gate electrode 111. In manufacturing the transistor 414, a mask is formed over the insulating layer 100 and the conductive layer 110, a slimming process is performed on the mask to be reduced in size, and the insulating film 101 and the gate electrode 111 are formed using the mask reduced in size. After that, a conductive film is formed and processed into the conductive film 112.

Thus, a transistor 410 including an oxide semiconductor film whose channel length (L) is reduced can be formed.

According to one embodiment of the present invention, the mask is reduced in size by the slimming process, whereby the channel length (L) of the transistor 410 can be reduced, and the transistor 410 includes the oxide semiconductor film, whereby high-speed operation of the transistor becomes possible.

Further, according to another embodiment of the present invention, by planarization of part of the gate insulating film 120 in contact with the channel region of the oxide semiconductor film 140, high-speed operation of the transistor can be achieved.

Further, according to another embodiment of the present invention, the insulating film 101 having a projection is used, whereby the source or drain electrode 130*a* and the source or drain electrode 130*b* are formed in a self-aligned manner. Accordingly, misalignment is not caused in forming the source or drain electrode 130*a* and the source or drain electrode 130*b*, so that the channel length can be reduced. Thus, a highly reliable semiconductor device can be manufactured, and yield and productivity can be improved.

The methods and structures described in this embodiment can be combined as appropriate with any of the methods and structures described in the other embodiments.

Embodiment 3

In this embodiment, the appearance and a cross section of a liquid crystal display panel, which is one embodiment of a semiconductor device, will be described with reference to FIGS. 8A to 8C. The liquid crystal display panel illustrated in FIGS. 8A to 8C includes transistors illustrated in Embodiment 1 or 2. FIGS. 8A and 8C are plan views of panels in which transistors 4010 and 4011 and a liquid crystal element 4013 are sealed between a first substrate 4001 and a second substrate 4006 with a sealant 4005. FIG. 8B is a cross-sectional view taken along line M-N in FIG. 8A or FIG. 8C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. Moreover, a signal line driver circuit 4003, which is formed using a single crystal semiconductor film or a polycrystalline semiconductor film over a substrate prepared separately, is provided in a region different from the region surrounded by the sealant 4005 over the first substrate 4001.

Note that the connection method of a driver circuit which is separately formed is not particularly limited, and a COG method, a wire bonding method, a TAB method, or the like can be used. FIG. 8A illustrates an example in which the signal line driver circuit 4003 is mounted by a COG method. FIG. 8C illustrates an example in which the signal line driver circuit 4003 is mounted by a TAB method.

The pixel portion 4002 and the scan line driver circuit 4004 provided over the first substrate 4001 include a plurality of transistors. FIG. 8B illustrates the transistor 4010 included in the pixel portion 4002 and the transistor 4011 included in the scan line driver circuit 4004. In FIG. 8B, insulating layers 4041, 4042, and 4021 are provided over the transistors 4010 and 4011.

As the transistors 4010 and 4011, the transistors described in Embodiment 1 or 2 can be used. In this embodiment, the transistors 4010 and 4011 are n-channel transistors.

A conductive layer 4040 is provided over the insulating layer 4021 and at a position which overlaps with a channel formation region of the oxide semiconductor film in the transistor 4011 for the driver circuit. The conductive layer 4040 is provided at the position which overlaps with the channel formation region of the oxide semiconductor film, whereby the reliability of the transistor can be improved. For example, in a bias-temperature stress test (also referred to as a BT test), the amount of change in the threshold voltage of the transistor 4011 before and after the BT test can be reduced. The potential of the conductive layer 4040 may be the same or different from that of a gate electrode of the transistor 4011. The conductive layer 4040 can also function as a second gate electrode. The potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 interposed therebetween.

Note that as the first substrate 4001 and the second substrate 4006, a light-transmitting substrate, for example, a plastic substrate such as a polyester film or an acrylic resin film, a glass substrate, or a ceramic substrate can be used.

A spacer 4035 is a columnar spacer obtained by selective etching of an insulating film and provided in order to control the distance (a cell gap) between the pixel electrode layer 4030 and the counter electrode layer 4031. Alternatively, a spherical spacer may also be used. The counter electrode layer 4031 is electrically connected to a common potential line provided over the same substrate as the transistor 4010. With use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. In that case, the electrodes are arranged differently from those illustrated in FIGS. 8A to 8C because a horizontal electric field mode is employed. For example, the pixel electrode layer and a common electrode layer are arranged over the same insulating layer, and a horizontal electric field is applied to the liquid crystal layer. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer 4008 in order to improve the temperature range. The liquid crystal composition which includes a liquid crystal exhibiting a blue phase and a chiral agent has a short response time of less than or equal to 1 millisecond, has optical isotropy; therefore, alignment treatment is not necessary and viewing angle dependence is small.

Note that this embodiment can also be applied to a transflective liquid crystal display device in addition to a transmissive liquid crystal display device.

The liquid crystal display device may be provided with a polarizing plate and a coloring layer. A position where the polarizing plate and the coloring layer are provided and the stacked-layer structure thereof may be set as appropriate depending on materials of the polarizing plate and the coloring layer or conditions of manufacturing process. Further, a light-blocking film serving as a black matrix may be provided in a portion other than the display portion.

Over the transistors 4011 and 4010, the insulating layer 4041 is formed in contact with the oxide semiconductor film. The protective insulating layer 4042 is formed on and in contact with the insulating layer 4041. Note that in order to reduce the surface roughness of the transistors, the protective insulating layer 4042 may be covered with the insulating layer 4021 functioning as a planarization insulating film.

The insulating layer 4021 is formed as the planarization insulating film. As the insulating layer 4021, an organic material having heat resistance such as polyimide, acrylic resin, benzocyclobutene resin, polyamide, or epoxy resin can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using these materials.

A formation method of the insulating layer 4021 is not particularly limited, and the following method can be employed depending on the material: a method such as a sputtering method, an SOG method, a spin coating method, a dipping method, a spray coating method, a droplet discharge method (e.g., an ink-jet method, screen printing, offset printing, or the like), or a tool (equipment) such as a doctor knife, a roll coater, a curtain coater, a knife coater, or the like. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as a source or drain electrode of each of the transistor 4010 and the transistor 4011.

The connection terminal electrode 4015 is electrically connected to a terminal included in the FPC 4018 via an anisotropic conductive film 4019.

Note that FIGS. 8A to 8C illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

The liquid crystal display panel described in this embodiment includes transistors having favorable electric characteristics and high reliability described in Embodiment 1 or 2; therefore, the liquid crystal display panel having favorable quality can be provided.

The methods and structures described in this embodiment can be combined as appropriate with any of the methods and structures described in the other embodiments.

Embodiment 4

In this embodiment, an example of electronic paper will be described as an embodiment of a semiconductor device.

The transistor described in Embodiment 1 or 2 can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by the transistors described in Embodiment 1 or 2 can be used.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, and a magnetophoretic material or formed using a composite material of any of these.

Figure 9:
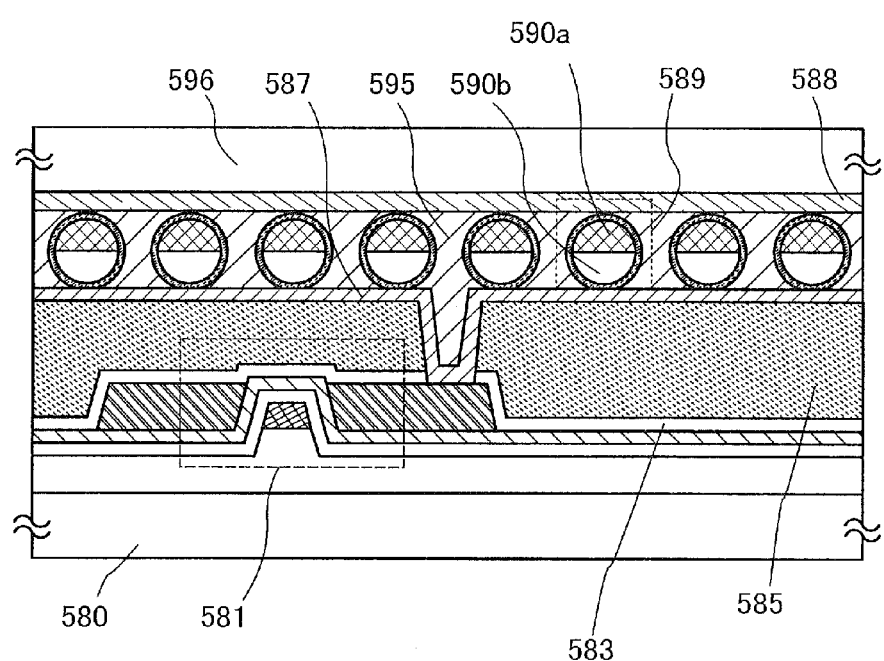
FIG. 9 is a cross-sectional view of a semiconductor device.

FIG. 9 illustrates active matrix electronic paper as an example of a semiconductor device. A transistor 581 used for the semiconductor device can be manufactured in a manner similar to that of the transistors described in Embodiment 1 or 2 and has favorable electric characteristics and high reliability.

The electronic paper in FIG. 9 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIG. 9, the transistor 581 is a bottom-gate transistor. The transistor described in Embodiment 1 or 2 can be used for the transistor 581.

A source electrode or a drain electrode of the transistor 581 is in contact with and electrically connected to a first electrode layer 587 in an opening portion formed in an insulating layer 583 and an insulating layer 585. Between the first electrode layer 587 and a second electrode layer 588, spherical particles 589 each having a black region 590a and a white region 590b around which is filled with liquid, are provided between a pair of substrates 580 and 596. A space around the spherical particles 589 is filled with a filler 595 such as a resin.

In addition, the first electrode layer 587 corresponds to a pixel electrode, and the second electrode layer 588 corresponds to a common electrode. The second electrode layer 588 is electrically connected to a common potential line provided over the same substrate as the transistor 581. With the use of a common connection portion, the second electrode layer 588 and the common potential line can be electrically connected to each other through conductive particles arranged between the pair of substrates 580 and 596.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. Further, even when power is not supplied to the display portion, an image which has been displayed once can be maintained. Accordingly, a displayed image can be stored even if a semiconductor device having a display function (which may simply be referred to as a display device or a semiconductor device provided with a display device) is distanced from an electric wave source.

Through the above steps, an electronic paper including any of the transistors described in Embodiment 1 or 2 can be manufactured. The electronic paper described in this embodiment includes the transistor having favorable electric characteristics and high reliability described in Embodiment 1 or 2; therefore, the electronic paper having favorable quality can be provided.

This embodiment can be combined with any of the structures described in the other embodiments as appropriate.

Embodiment 5

In this embodiment, as an example of a semiconductor device, a memory medium (a memory element) will be described. In this embodiment, the transistor using an oxide semiconductor described in Embodiment 1 and a transistor including a material other than an oxide semiconductor are formed over one substrate.

Figure 10A:
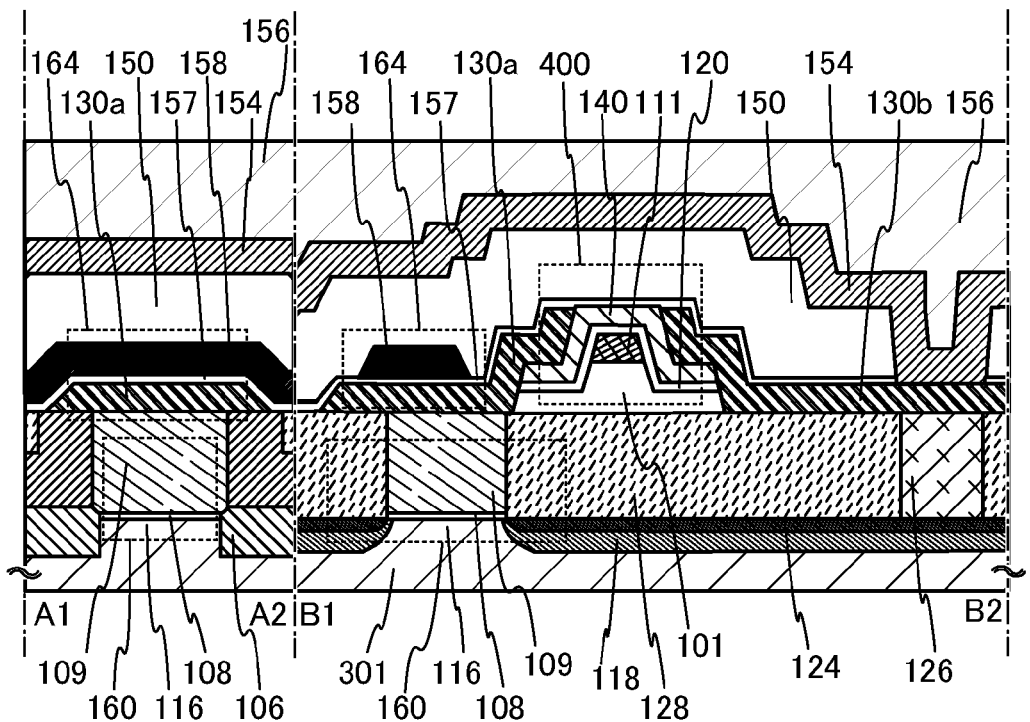
FIGS. 10A to 10C are a cross-sectional view, a plan view, and a circuit diagram, respectively, of a semiconductor device.
Figure 10B:
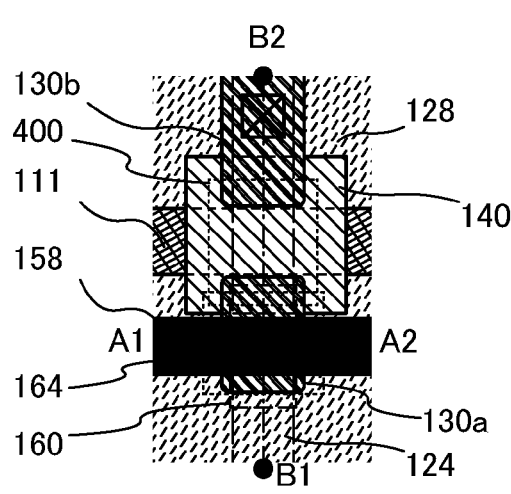
Figure 10C:
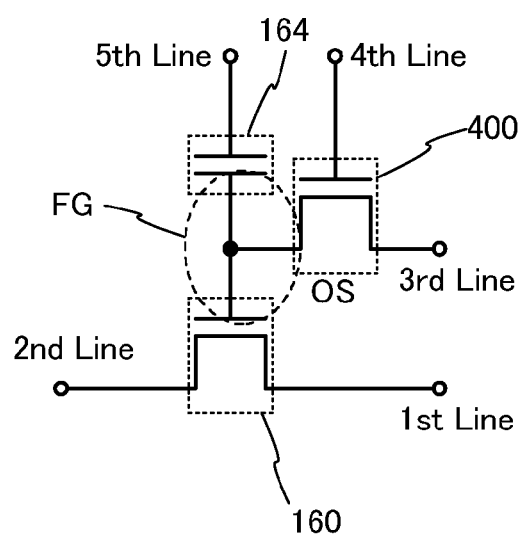

FIGS. 10A to 10C illustrate an example of a structure of a semiconductor device. FIG. 10A illustrates a cross section of the semiconductor device, and FIG. 10B illustrates a plan view of the semiconductor device. Here, FIG. 10A illustrates a cross section taken along line A1-A2 and line B1-B2 in FIG. 10B. FIG. 10C illustrates an example of a diagram of a circuit including the semiconductor device as a memory element. The semiconductor device illustrated in FIGS. 10A and 10B includes a transistor 160 including a first semiconductor material in a lower portion, and a transistor including a second semiconductor material in an upper portion. In this embodiment, the transistor 160 which is a first transistor includes a semiconductor material other than an oxide semiconductor. As a second transistor, the transistor 400 including an oxide semiconductor which is described in Embodiment 1 is used. As the semiconductor material other than an oxide semiconductor, for example, silicon, germanium, silicon germanium, silicon carbide, gallium arsenide, or the like can be used, and a single crystal semiconductor is preferably used. A transistor including such a semiconductor material other than an oxide semiconductor can operate at high speed easily. On the other hand, the transistor 400 including an oxide semiconductor can hold charge for a long time because of its characteristics. Note that as the second transistor, the transistor described in Embodiment 1 or 2 can be used as appropriate.

The transistor 160 in FIGS. 10A to 10C includes a channel formation region 116 provided in a substrate 301 including a semiconductor material (such as silicon), impurity regions 118 provided such that the channel formation region 116 is sandwiched therebetween, metal compound regions 124 in contact with the impurity regions 118, a gate insulating layer 108 provided over the channel formation region 116, and a gate electrode 109 provided over the gate insulating layer 108.

As the substrate 301 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

An electrode 126 is connected to part of the metal compound region 124 of the transistor 160. Here, the electrode 126 functions as a source electrode or a drain electrode of the transistor 160. Further, an element isolation insulating layer 106 is formed so as to surround the transistor 160, and an insulating layer 128 is formed to cover the transistor 160. Note that in order to realize higher integration, the transistor 160 preferably has a structure without a sidewall insulating layer as illustrated in FIG. 10A. On the other hand, when importance is put on the characteristics of the transistor 160, sidewall insulating layers may be provided on side surfaces of the gate electrode 109, and the impurity region 118 may include regions with different impurity concentrations.

The transistor 160 can be formed by a known technique. A feature of the transistor 160 including, for example, silicon, germanium, silicon germanium, silicon carbide, gallium arsenide, or the like, as a semiconductor material is that it can operate at high speed. Thus, when the transistor is used as a reading transistor, data can be read at a high speed.

After the transistor 160 is formed, as treatment prior to the formation of the transistor 400 and a capacitor 164, the insulating layer 128 is subjected to CMP treatment so that the top surface of the gate electrode 109 is exposed. As treatment for exposing the top surface of the gate electrode 109, as well as CMP treatment, etching treatment or the like can be employed; in order to improve characteristics of the transistor 400, the surface of the insulating layer 128 is preferably made as planar as possible.

Next, an insulating film and a conductive film are stacked over the gate electrode 109, the insulating layer 128, and the like. A mask formed over the conductive film is reduced (slimmed) by a plasma treatment or the like, and the insulating film and the conductive film are processed using the mask, whereby the insulating film 101 having a projection is formed and the gate electrode 111 is formed over the top surface of the projection of the insulating film 101. After formation of the gate electrode 111, by a method similar to that described in Embodiment 1, the gate insulating film 120 and the oxide semiconductor film 140 are formed. After that, the insulating film 101, the gate insulating film 120, and the oxide semiconductor film 140 are selectively etched, whereby the gate electrode 109 of the transistor 160 and the electrode 126 are exposed.

Note that as illustrated in FIG. 10A, in the case where the insulating film 101, the gate insulating film 120, and the oxide semiconductor film 140 are processed so as to expose part of the insulating layer 128, the material and etching conditions are adjusted as appropriate so that the insulating layer 128 is not removed. Note that depending on the material and etching conditions, part of the insulating layer 128 which is exposed is partially etched in some cases. Further, this embodiment is not limited to the structure illustrated in FIG. 10A. The insulating film 101, the gate insulating film 120, and the oxide semiconductor film 140 may be processed so that an end portion of the insulating film 101 overlaps with the gate electrode 109 and/or the electrode 126. Alternatively, an opening portion (a contact hole) is formed in the insulating film 101, the gate insulating film 120, and the oxide semiconductor film 140, whereby the gate electrode 109 and the electrode 126 may be partially exposed.

After that, a conductive film is formed so as to cover the gate electrode 109, the electrode 126, the insulating layer 128, the oxide semiconductor film 140, and the like, which are exposed, and the conductive film is processed in a manner similar to the method described in Embodiment 1, thereby forming the source or drain electrode 130a and the source or drain electrode 130b. The source or drain electrode 130a is electrically connected to the gate electrode 109 of the transistor 160. The source or drain electrode 130b is electrically connected to the electrode 126 of the transistor 160.

In the semiconductor device illustrated in FIG. 10A, an insulating layer 157 is provided over the transistor 400, and a conductive layer 158 is provided over the insulating layer 157 so as to at least partially overlap with the source or drain electrode 130a. That is, the conductive layer 158 functions as one of electrodes of the capacitor 164. The insulating layer 157 can be formed using the same material as the gate insulating film 120, and the conductive layer 158 can be formed using the same material as the gate electrode 111.

An insulating layer 150 is provided over the insulating layer 157 and the conductive layer 158. A wiring 154 is provided over the insulating layer 150. The wiring 154 is connected to the source or drain electrode 130b through an opening portion formed in the insulating layer 157, the insulating layer 150, or the like. The wiring 154 is provided so as to overlap with at least part of the oxide semiconductor film 140 of the transistor 400. Further, an insulating layer 156 is provided so as to cover the wiring 154. Note that at least one of the insulating layer 157 and the insulating layer 150 is preferably an insulating film from which oxygen can be released by heat treatment. With the use of the insulating film, oxygen can be supplied to the oxide semiconductor film 140, so that oxygen deficiency in the oxide semiconductor film 140 can be filled.

In the semiconductor device illustrated in FIG. 10A, the transistor 160 and the transistor 400 are provided so as to at least partially overlap with each other. In particular, a source region or a drain region of the transistor 160 is provided so as to overlap with part of the oxide semiconductor film 140. Further, the wiring 154 is provided so as to overlap with at least part of the oxide semiconductor film 140. In addition, the transistor 400 and the capacitor 164 are provided so as to overlap with the transistor 160. For example, the conductive layer 158 of the capacitor 164 is provided so as to at least partially overlap with the gate electrode 109 of the transistor 160. With such a planar layout, the semiconductor device can be highly integrated. For example, in the case of forming a memory cell using the semiconductor device, given that the minimum feature size is F, the area occupied by a memory cell can be 15 $F^2$ to 25 $F^2$.

In addition, FIG. 10C illustrates an example of a diagram of a circuit using the semiconductor device as a memory element. In FIG. 10C, one of a source electrode and drain electrode of the transistor 400, one electrode of the capacitor 164, and a gate electrode of the transistor 160 are electrically connected to one another. A first wiring (a 1st line, also referred to as a source line) is electrically connected to a source electrode of the transistor 160. A second wiring (a 2nd line, also referred to as a bit line) is electrically connected to a drain electrode of the transistor 160. A third wiring (a 3rd line, also referred to as a first signal line) is electrically connected to the source or drain electrode of the transistor 400. A fourth wiring (a 4th line, also referred to as a second signal line) is electrically connected to the gate electrode of the transistor 400. A fifth wiring (a 5th line, also referred to as a word line) and the other electrode of the capacitor 164 are electrically connected to each other.

The transistor 400 including an oxide semiconductor has extremely low off current; therefore, when the transistor 400 is turned off, the potential of a node (hereinafter, a node FG) where one of the source electrode and drain electrode of the transistor 400, one electrode of the capacitor 164, and the gate electrode of the transistor 160 are electrically connected to each other can be held for an extremely long time. The capacitor 164 facilitates holding of charge given to the node FG and reading of the held data.

When data is stored in the semiconductor device (writing), first, the potential of the fourth wiring is set to a potential at which the transistor 400 is turned on, whereby the transistor 400 is turned on. Thus, the potential of the third wiring is applied to the node FG and a predetermined amount of charge is accumulated in the node FG. Here, charge for applying either two different potential levels (hereinafter referred to as low-level charge and high-level charge) is given to the node FG. After that, the potential of the fourth wiring is set to a potential at which the transistor 400 is turned off, whereby the transistor 400 is turned off. This makes the node FG floating and the predetermined amount of charge remains held in the node FG. The predetermined amount of charge is thus accumulated and held in the node FG, whereby the memory cell can store data.

Since the off current of the transistor 400 is extremely small, the charge supplied to the node FG is held for a long time. This can remove the need of refresh operation or drastically reduce the frequency of the refresh operation, which leads to a sufficient reduction in power consumption. Moreover, stored data can be stored for a long time even when power is not supplied.

When stored data is read out (reading), while a predetermined potential (a fixed potential) is applied to the first wiring, an appropriate potential (a read-out potential) is applied to the fifth wiring, whereby the transistor 160 changes its state depending on the amount of charge held in the node FG. This is because, in general, when the transistor 160 is an n-channel transistor, an apparent threshold voltage $V_{th\_H}$ of the transistor 160 in the case where a high-level charge is held in the node FG is lower than an apparent threshold voltage $V_{th\_L}$ of the transistor 160 in the case where a low-level charge is held in the node FG. Here, an apparent threshold voltage refers to the potential of the fifth line, which is needed to turn on the transistor 160. Thus, by setting the potential of the fifth wiring to a potential $V_0$ which is between $V_{th\_H}$ and $V_{th\_L}$, charge held in the node FG can be determined. For example, in the case where a high-level charge is given in writing, when the potential of the fifth wiring is set to $V_0$ (>$V_{th\_H}$), the transistor 160 is turned on. In the case where a low level charge is given in writing, even when the potential of the fifth wiring is set to $V_0$ (<$V_{th\_L}$), the transistor 160 remains in an off state. In such a manner, by controlling the potential of the fifth wiring and determining whether the transistor 160 is in an on state or off state (reading out the potential of the second wiring), stored data can be read out.

Further, in order to rewrite stored data, a new potential is applied to the node FG that is holding the predetermined amount of charge given in the above writing, so that the charge of the new data is held in the node FG. Specifically, the potential of the fourth wiring is set to a potential at which the transistor 400 is turned on, whereby the transistor 400 is turned on. The potential of the third wiring (a potential of new data) is applied to the node FG, and the predetermined amount of charge is accumulated in the node FG. After that, the potential of the fourth wiring is set to a potential at which the transistor 400 is turned off, whereby the transistor 400 is turned off. Thus, charge of the new data is held in the node FG. In other words, while the predetermined amount of charge given in the first writing is held in the node FG, the same operation (a second writing) as in the first writing is performed, whereby the stored data can be overwritten.

The off current of the transistor 400 described in this embodiment can be sufficiently reduced by using the highly-purified, and intrinsic oxide semiconductor film 140. Then, by using such a transistor, a semiconductor device in which stored data can be stored for an extremely long time can be obtained. Further, with the use of the transistor 400 whose channel length (L) is reduced, the degree of integration of the semiconductor device can be increased.

In the semiconductor device described in this embodiment, the transistor 160 and the transistor 400 are overlapping with each other; therefore, a semiconductor device in which the degree of integration is sufficiently improved can be realized.

The methods and structures described in this embodiment can be combined as appropriate with any of the methods and structures described in the other embodiments.

Embodiment 6

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

In this embodiment, examples of an electronic device on which a transistor with favorable electric characteristics and high reliability which can be obtained in any of the above embodiments is mounted will be described with reference to FIGS. 11A to 11E.

Figure 11A:
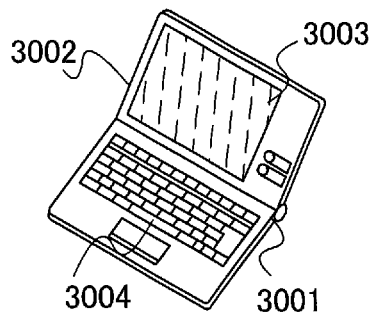
FIGS. 11A to 11E are views each illustrating an electronic device.

FIG. 11A illustrates a laptop personal computer, which includes a main body 3001, a housing 3002, a display portion 3003, a keyboard 3004, and the like. Note that the laptop personal computer includes a semiconductor device. The semiconductor device includes the transistor described in any of the above embodiments. Therefore, the laptop personal computer with favorable quality and high reliability can be realized.

Figure 11D:
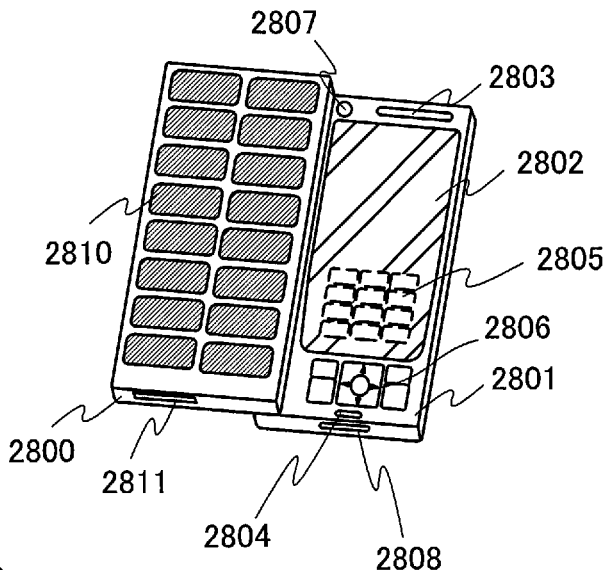
Figure 11B:
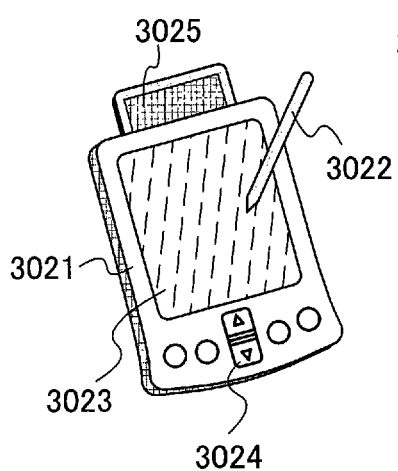

FIG. 11B illustrates a portable information terminal (PDA) which includes a display portion 3023, an external interface 3025, operation buttons 3024, and the like in a main body 3021. A stylus 3022 is included as an accessory for operation. Note that the portable information terminal (PDA) includes a semiconductor device. The semiconductor device includes the transistor described in any of the above embodiments. Therefore, the portable information terminal (PDA) with favorable quality and high reliability can be realized.

Figure 11E:
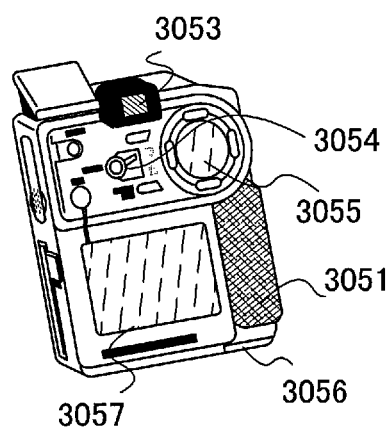
Figure 11C:
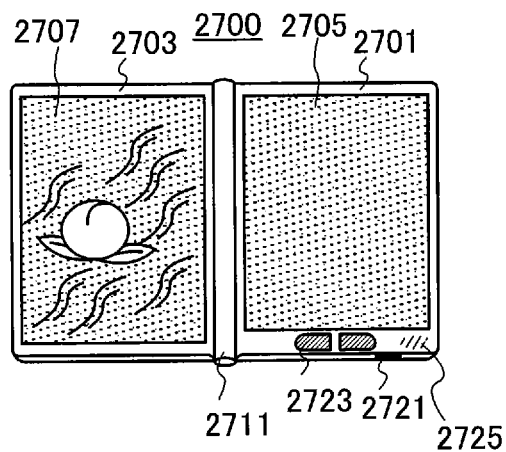

FIG. 11C illustrates an e-book reader on which the electronic paper described in Embodiment 4 is mounted as a component. FIG. 11C illustrates an example of an e-book reader. For example, the e-book reader 2700 includes two housings, a housing 2701 and a housing 2703. The housings 2701 and 2703 are bound with each other by an axis portion 2711, along which the e-book reader 2700 can be opened and closed. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 11C) can display text and the left display portion (the display portion 2707 in FIG. 11C) can display graphics. At least one of the housings 2701 and 2703 includes a semiconductor device. The semiconductor device includes the transistor described in any of the above embodiments. Therefore, the e-book reader with favorable quality and high reliability can be realized.

FIG. 11C illustrates an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, or the like may also be provided on the surface of the housing, on which the display portion is provided. Further, a rear surface or a side surface of the housing may be provided with an external connection terminal (an earphone terminal, a USB terminal, a terminal which can be connected with an AC adapter or a variety of cables such as a USB cable), a storage medium inserting portion, or the like. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

FIG. 11D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2801 is provided with a solar battery cell 2810 for charging of the portable information terminal, an external memory slot 2811, and the like. Further, an antenna is incorporated in the housing 2801. Note that the mobile phone includes the transistor described in any of the above embodiments at least as a component.

The display panel 2802 is provided with a touch panel. A plurality of operation keys 2805 which is displayed as images is illustrated by dashed lines in FIG. 11D. Note that a boosting circuit by which a voltage output from the solar battery cell 2810 is increased to be sufficiently high for each circuit is also included. Note that a boosting circuit by which a voltage output from the solar battery cell 2810 is increased to be a voltage necessary for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 11D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be transferred. As the recording medium, the semiconductor device described in Embodiment 5 can be used. According to Embodiment 5, with the use of the transistor in which the off current can be sufficiently reduced, a semiconductor device capable of holding stored data for an extremely long time can be obtained.

Further, in addition to the above functions, an infrared communication function, a television reception function, or the like may be provided.

FIG. 11E is a digital camera which includes a main body 3051, a display portion (A) 3057, an eyepiece 3053, operation switches 3054, a display portion (B) 3055, a battery 3056, and the like. Note that the digital camera includes a semiconductor device. The semiconductor device includes the transistor described in any of the above embodiments. Therefore, the digital camera with favorable quality and high reliability can be realized.

As described above, the electronic devices described in this embodiment each include the semiconductor device described in any of the above embodiments. Therefore, electronic devices having favorable qualities can be realized.

Embodiment 7

Figure 12A:
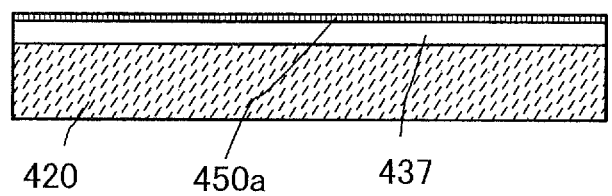
FIGS. 12A to 12C are cross-sectional views illustrating a manufacturing process of a semiconductor device.
Figure 12B:
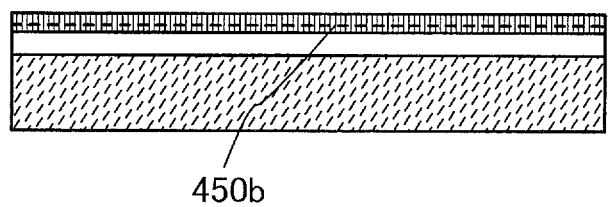

One embodiment of an oxide semiconductor film that can be used for the semiconductor layers of the transistors in Embodiments 1 to 6 will be described with reference to FIGS. 12A to 12C.

The oxide semiconductor film of this embodiment has a stacked-layer structure including a first crystalline oxide semiconductor film and a second crystalline oxide semiconductor film thereover which is thicker than the first crystalline oxide semiconductor film.

An insulating layer 437 is formed over an insulating layer 420. In this embodiment, an oxide insulating layer with a thickness greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film with a thickness greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 nm in an oxygen atmosphere, an argon atmosphere, or an atmosphere including argon and oxygen under conditions where a deposition target for an oxide semiconductor (a target for an In—Ga—Zn-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Then, first heat treatment is performed with the substrate placed in an atmosphere of nitrogen or dry air. The temperature of the first heat treatment is higher than or equal to 400° C. and lower than or equal to 750° C. Through the first heat treatment, a first crystalline oxide semiconductor film 450a is formed (see FIG. 12A).

Depending on the substrate temperature at the time of deposition or the temperature of the first heat treatment, the deposition or the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor film 450a or the vicinity of the interface (within ±5 nm from the interface), whereby oxygen deficiency in the first crystalline oxide semiconductor film is reduced. Therefore, it is preferable that oxygen be included in (in a bulk of) the insulating layer 437 used as a base insulating layer or at the interface between the first crystalline oxide semiconductor film 450a and the insulating layer 437 at an amount that exceeds at least the amount of oxygen in the stoichiometric composition ratio.

Next, a second oxide semiconductor film with a thickness more than 10 nm is formed over the first crystalline oxide semiconductor film 450a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor film formed over and in contact with the surface of the first crystalline oxide semiconductor film and so-called orderliness can be obtained.

In this embodiment, the second oxide semiconductor film is formed to a thickness of 25 nm in an oxygen atmosphere, an argon atmosphere, or a mixed atmosphere of argon and oxygen under conditions that a target for an oxide semiconductor (a target for an In—Ga—Zn—O-based oxide semiconductor containing $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power source is 0.5 kW.

Then, second heat treatment is performed with the substrate placed in an atmosphere of nitrogen atmosphere, an oxygen atmosphere or a mixed atmosphere of nitrogen and oxygen. The temperature of the second heat treatment is higher than or equal to 400° C. and lower than or equal to 750° C. Through the second heat treatment, a second crystalline oxide semiconductor film 450b is formed (see FIG. 12B). The second heat treatment is performed in a nitrogen atmosphere, an oxygen atmosphere, or a mixed atmosphere of nitrogen and oxygen, whereby the density of the second crystalline oxide semiconductor film is increased. The second heat treatment is preferably performed in an atmosphere containing oxygen because defects in the second crystalline oxide semiconductor film 450b are reduced. By the second heat treatment, crystal growth proceeds in the thickness direction with the use of the first crystalline oxide semiconductor film 450a as a nucleus, that is, crystal growth proceeds from the bottom to the inside; thus, the second crystalline oxide semiconductor film 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of lower than or equal to −40° C., preferably a dew point of lower than or equal to −50° C. may be employed.

Figure 12C:
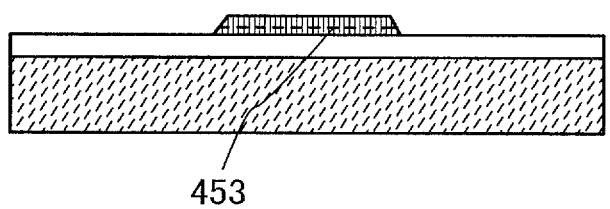

Next, the stack of the oxide semiconductor layers, the first crystalline oxide semiconductor film 450a and the second crystalline oxide semiconductor film 450b, is processed into an oxide semiconductor film 453 including a stack of island-shaped oxide semiconductor layers (see FIG. 12C). In the drawing, the interface between the first crystalline oxide semiconductor film 450a and the second crystalline oxide semiconductor film 450b is indicated by a dotted line, and the first crystalline oxide semiconductor film 450a and the second crystalline oxide semiconductor film 450b are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask may be formed by a method such as photolithography or an ink-jet method.

For the etching of the stack of oxide semiconductor layers, either wet etching or dry etching may be employed. It is needless to say that both of them may be employed in combination.

Further, one feature of the first crystalline oxide semiconductor film and the second crystalline oxide semiconductor film obtained by the above formation method is that they have c-axis alignment. Note that the first crystalline oxide semiconductor layer and the second crystalline oxide semiconductor layer comprise an oxide including a crystal with c-axis alignment (also referred to as C-Axis Aligned Crystal (CAAC)), which has neither a single crystal structure nor an amorphous structure. Further, the first crystalline oxide semiconductor film and the second crystalline oxide semiconductor film partly include a crystal grain boundary.

Note that the first crystalline oxide semiconductor film and the second crystalline oxide semiconductor film are each formed using an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. Note that, for example, an In—Ga—Zn-based oxide means an oxide containing In, Ga, and Zn, and there is no limitation on the ratio of In, Ga, and Zn. The In—Ga—Zn-based oxide may include a metal element other than In, Ga, and Zn.

Without limitation to the two-layer structure in which the second crystalline oxide semiconductor film is formed over the first crystalline oxide semiconductor film, a stacked-layer structure including three or more layers may be formed by repeatedly performing a process of film formation and heat treatment for forming a third crystalline oxide semiconductor film after the second crystalline oxide semiconductor film is formed.

The oxide semiconductor film 453 including the stack of the oxide semiconductor layers formed by the above formation method can be used as appropriate for a transistor (e.g., the transistor in Embodiment 1 and Embodiment 2) which can be applied to a semiconductor device disclosed in this specification.

In the transistor 4011 according to Embodiment 3, in which the stack of the oxide semiconductor layers of this embodiment is used as the oxide semiconductor film 453, an electric field is not applied from one surface to the other surface of the oxide semiconductor film and current does not flow in the thickness direction (from one surface to the other surface; specifically, in the vertical direction in the transistor 4011 in FIG. 8B) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of the first crystalline oxide semiconductor film and the second crystalline oxide semiconductor film, like the oxide semiconductor film 453, the transistor can have stable electric characteristics and high reliability.

This embodiment can be implemented in appropriate combination with the structures described in the other embodiments.

This application is based on Japanese Patent Application Serial No. 2010-204187 filed with Japan Patent Office on Sep. 13, 2010, the entire contents of which are hereby incorporated by reference.

What is claimed is:

1. A method for manufacturing a semiconductor device comprising steps of:
forming a first conductive film over a first insulating film;
forming a first mask over the first conductive film;
performing a slimming process on the first mask to form a second mask;
performing an etching process on the first insulating film and the first conductive film using the second mask to form a second insulating film having a projection and to form a gate electrode over a top surface of the projection of the second insulating film;
forming a gate insulating film over the second insulating film and the gate electrode so as to cover the gate electrode;
performing a planarization process on part of a surface of the gate insulating film which overlaps with the top surface of the projection of the second insulating film;
forming an oxide semiconductor film over the gate insulating film; and
forming a source electrode and a drain electrode over the oxide semiconductor film so as not to overlap with the top surface of the projection of the second insulating film.

2. The method for manufacturing a semiconductor device according to claim 1, wherein a plasma treatment is used in the slimming process.

3. The method for manufacturing a semiconductor device according to claim 2, wherein as the plasma treatment, an ashing process is used.

4. The method for manufacturing a semiconductor device according to claim 1, wherein a line width of the second mask is greater than or equal to 20 nm and less than or equal to 2000 nm.

5. The method for manufacturing a semiconductor device according claim 1, wherein as the planarization process, at least one of chemical mechanical polishing treatment and plasma treatment is used.

6. The method for manufacturing a semiconductor device according to claim 1, wherein the source electrode and the drain electrode is formed by performing at least one of an etching process and chemical mechanical polishing treatment on a second conductive film formed over the second insulating film and the gate electrode.

7. The method for manufacturing a semiconductor device according to claim 1, wherein a root-mean-square roughness of the surface of the gate insulating film which overlaps with the top surface of the projection of the second insulating film is made to be less than or equal to 1 nm by the planarization process.

8. A method for manufacturing a semiconductor device comprising steps of:
forming a first conductive film over a first insulating film;
forming a first mask over the first conductive film;
performing a slimming process on the first mask to form a second mask;
performing a first etching process on the first insulating film and the first conductive film using the second mask to form a second insulating film having a projection and to form a gate electrode over a top surface of the projection of the second insulating film;
forming a gate insulating film over the second insulating film and the gate electrode so as to cover the gate electrode;
performing a planarization process on part of a surface of the gate insulating film which overlaps with the top surface of the projection of the second insulating film;
forming an oxide semiconductor film over the gate insulating film;
forming a second conductive film over the oxide semiconductor film;
forming a source electrode and a drain electrode by performing chemical mechanical polishing treatment on the second conductive film until a region of the oxide semiconductor film which overlaps with the top surface of the projection is exposed; and
performing an etching treatment on the source electrode and the drain electrode so as to form a difference in height between a top surface of the region of the oxide semiconductor film and a surface of an uppermost portion of each of the source electrode and the drain electrode.

9. The method for manufacturing a semiconductor device according to claim 8, wherein a plasma treatment is used in the slimming process.

10. The method for manufacturing a semiconductor device according to claim 9, wherein as the plasma treatment, an ashing process is used.

11. The method for manufacturing a semiconductor device according to claim 8, wherein a line width of the second mask is greater than or equal to 20 nm and less than or equal to 2000 nm.

12. The method for manufacturing a semiconductor device according claim 8, wherein as the planarization process, at least one of chemical mechanical polishing treatment and plasma treatment is used.

13. The method for manufacturing a semiconductor device according to claim 8, wherein a root-mean-square roughness of the surface of the gate insulating film which overlaps with the top surface of the projection of the second insulating film is made to be less than or equal to 1 nm by the planarization process.

* * * * *